US012568738B2

(12) United States Patent
Yu

(10) Patent No.: US 12,568,738 B2
(45) Date of Patent: Mar. 3, 2026

(54) DISPLAY SUBSTRATE AND DISPLAY PANEL WITH LIGHT EMITTING DEVICE ELECTRODE HAVING AN INCLINED SURFACE

(71) Applicants: Chengdu BOE Optoelectronics Technology Co., Ltd., Chengdu (CN); BOE Technology Group Co., Ltd., Beijing (CN)

(72) Inventor: Tiancheng Yu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 650 days.

(21) Appl. No.: 17/606,525

(22) PCT Filed: Dec. 25, 2020

(86) PCT No.: PCT/CN2020/139478

§ 371 (c)(1),
(2) Date: Oct. 26, 2021

(87) PCT Pub. No.: WO2022/134015

PCT Pub. Date: Jun. 30, 2022

(65) Prior Publication Data

US 2022/0208942 A1     Jun. 30, 2022

(51) Int. Cl.
H10K 59/131 (2023.01)
H10K 59/35 (2023.01)
(52) U.S. Cl.
CPC ......... H10K 59/131 (2023.02); H10K 59/353 (2023.02)

(58) Field of Classification Search
CPC .. H10K 59/131; H10K 59/353; H10K 59/352; H10K 50/813; H10K 50/822; H10K 59/80515; H10K 59/80521
See application file for complete search history.

(56) References Cited

U.S. PATENT DOCUMENTS 9,929,222 B2     3/2018  Lim et al.
10,541,294 B2    1/2020  Hong et al.
(Continued)

FOREIGN PATENT DOCUMENTS

AU          2019279939 A1     2/2021
CN          106935621 A       7/2017
(Continued)

*Primary Examiner* — Sue A Purvis
*Assistant Examiner* — John Patrick Cornely
(74) *Attorney, Agent, or Firm* — Westman, Champlin & Koehler, P.A.

(57)                    ABSTRACT

A display substrate, including: a plurality of sub-pixels arranged on a first surface of a base substrate; and a plurality of signal lines arranged on the base substrate and arranged in the same layer as a source and a drain of a transistor of a pixel driving circuit of the sub-pixel. The plurality of signal lines include at least first signal lines extending in a first direction and are spaced apart in a second direction intersecting the first direction. The plurality of sub-pixels include a first sub-pixel, orthographic projections of two first side edge portions opposite in the second direction of a first electrode of the first sub-pixel on the base substrate partially overlap with orthographic projections of two adjacent first signal lines on the base substrate, respectively, so that a first inclined surface of the first electrode of the first sub-pixel is recessed toward the first surface.

17 Claims, 19 Drawing Sheets

(56)  References Cited

U.S. PATENT DOCUMENTS

| | | | |
|---|---|---|---|
| 10,811,489 | B2 | 10/2020 | Hong et al. |
| 11,233,103 | B2 | 1/2022 | Yeon et al. |
| 2015/0137101 | A1* | 5/2015 | Choi .................... H10K 50/822 |
| | | | 257/40 |
| 2018/0233079 | A1 | 8/2018 | Choi |
| 2018/0342570 | A1 | 11/2018 | Hong et al. |
| 2020/0058719 | A1 | 2/2020 | Yeon et al. |
| 2020/0152726 | A1 | 5/2020 | Hong et al. |
| 2021/0036094 | A1 | 2/2021 | Hong et al. |
| 2021/0159284 | A1 | 5/2021 | Huang et al. |
| 2021/0210563 | A1 | 7/2021 | Huang et al. |
| 2021/0408203 | A1 | 12/2021 | Shi et al. |

FOREIGN PATENT DOCUMENTS

| | | | |
|---|---|---|---|
| CN | 108933155 | A | 12/2018 |
| CN | 110610980 | A | 12/2019 |
| CN | 110838558 | A | 2/2020 |
| RU | 2721754 | C1 | 5/2020 |
| RU | 2727938 | C1 | 7/2020 |

* cited by examiner

<u>100</u>

100

DISPLAY SUBSTRATE AND DISPLAY PANEL WITH LIGHT EMITTING DEVICE ELECTRODE HAVING AN INCLINED SURFACE

CROSS REFERENCE TO RELATED APPLICATION(S)

This application is a Section 371 National Stage Application of International Application No. PCT/CN2020/139478, filed on Dec. 25, 2020, entitled "DISPLAY SUBSTRATE AND DISPLAY PANEL", the contents of which are incorporated herein by reference in its entirety.

TECHNICAL FIELD

The present disclosure relates to a field of a display technology, and in particular to a display substrate and a display panel.

BACKGROUND

Organic light emitting diode (OLED) display devices are a type of display devices that display information such as images by using a luminous OLED. The OLED display device has characteristics such as low power consumption, high brightness, and high response speed. With a development of OLED technology, requirements for display effects are getting higher and higher, and performance parameters such as color shift need to be improved continuously.

The above information disclosed in this section is only used for the understanding of the background of the technical concept of the present disclosure. Therefore, the above information may contain information that does not constitute the related art.

SUMMARY

In an aspect, there is provided a display substrate, including: a base substrate including a first surface; a plurality of sub-pixels arranged on the first surface of the base substrate, wherein the plurality of sub-pixels are arranged on the base substrate in an array in a first direction and a second direction, the sub-pixel includes a light emitting device and a pixel driving circuit for driving the light emitting device, the light emitting device includes a first electrode, and the pixel driving circuit includes a plurality of transistors including a source and a drain; and a plurality of signal lines arranged on the base substrate, wherein the plurality of signal lines are located in the same layer as the source and the drain of the transistor or located on a side of the source and the drain of the transistor away from the base substrate, wherein the plurality of signal lines include at least a first signal line extending in a first direction, two adjacent first signal lines are spaced apart in a second direction intersecting the first direction; and wherein the plurality of sub-pixels include a first sub-pixel, a first electrode of a light emitting device of the first sub-pixel includes two first side edge portions oppositely arranged in the second direction, orthographic projections of the two first side edge portions of the first electrode of the first sub-pixel on the base substrate partially overlap with orthographic projections of two adjacent first signal lines on the base substrate, respectively, so that a surface of the first electrode of the first sub-pixel away from the base substrate includes a first inclined surface gradually recessed toward the first surface in a direction from an edge of the first electrode to a center of the first electrode.

According to some exemplary embodiments, the plurality of signal lines further include a second signal line extending in the second direction, the first electrode of the light emitting device of the first sub-pixel includes two second side edge portions oppositely arranged in the first direction, and orthographic projections of the two second side edge portions of the first electrode of the first sub-pixel on the base substrate partially overlap with orthographic projections of two adjacent second signal lines on the base substrate, respectively.

According to some exemplary embodiments, the plurality of sub-pixels include a second sub-pixel, and an orthographic projection of a first electrode of a light emitting device of the second sub-pixel on the base substrate partially overlaps with an orthographic projection of a first signal line on the base substrate and an orthographic projection of a second signal line on the base substrate, so that a surface of the first electrode of the second sub-pixel away from the base substrate includes a second inclined surface gradually protruding away from the first surface in a direction from an edge of the first electrode toward a center of the first electrode.

According to some exemplary embodiments, the plurality of sub-pixels include a third sub-pixel, a first electrode of a light emitting device of the third sub-pixel includes two third side edge portions oppositely arranged in the second direction, orthographic projections of the two third side edge portions of the first electrode of the third sub-pixel on the base substrate partially overlap with orthographic projections of two adjacent first signal lines on the base substrate, respectively, so that a surface of the first electrode of the third sub-pixel away from the base substrate includes a third inclined surface recessed toward the first surface in a direction from an edge of the first electrode to a center of the first electrode.

According to some exemplary embodiments, the first electrode of the light emitting device of the third sub-pixel includes two fourth side edge portions oppositely arranged in the first direction, and orthographic projections of the two fourth side edge portions of the first electrode of the third sub-pixel on the base substrate partially overlap with orthographic projections of two adjacent second signal lines on the base substrate, respectively.

According to some exemplary embodiments, the first inclined surface includes a first inclined sub-surface inclined with respect to the first surface, and a second inclined sub-surface inclined with respect to the first surface.

According to some exemplary embodiments, an orthographic projection of an intersection of the first inclined sub-surface and the second inclined sub-surface on the base substrate is located between the orthographic projections of the two adjacent first signal lines on the base substrate; or the orthographic projection of the intersection of the first inclined sub-surface and the second inclined sub-surface on the base substrate is located between the orthographic projections of the two adjacent second signal lines on the base substrate.

According to some exemplary embodiments, the second inclined surface includes a third inclined sub-surface inclined with respect to the first surface, and a fourth inclined sub-surface inclined with respect to the first surface.

According to some exemplary embodiments, an orthographic projection of an intersection of the third inclined sub-surface and the fourth inclined sub-surface on the base substrate is located within the orthographic projection of the first signal line on the base substrate; or the orthographic projection of the intersection of the third inclined sub-surface and the fourth inclined sub-surface on the base substrate is located within the orthographic projection of the second signal line on the base substrate.

According to some exemplary embodiments, the third inclined surface includes a fifth inclined sub-surface inclined with respect to the first surface, and a sixth inclined sub-surface inclined with respect to the first surface.

According to some exemplary embodiments, an orthographic projection of an intersection of the fifth inclined sub-surface and the sixth inclined sub-surface on the base substrate is located between the orthographic projections of the two adjacent first signal lines on the base substrate; or the orthographic projection of the intersection of the fifth inclined sub-surface and the sixth inclined sub-surface on the base substrate is located between the orthographic projections of the two adjacent second signal lines on the base substrate.

According to some exemplary embodiments, a ratio of a distance between an orthographic projection of an intersection of the first inclined sub-surface and the second inclined sub-surface on the base substrate and one of the orthographic projections of the two adjacent first signal lines on the base substrate in the second direction, to a distance between the orthographic projection of the intersection of the first inclined sub-surface and the second inclined sub-surface on the base substrate and the other of the orthographic projections of the two adjacent first signal lines on the base substrate in the second direction is within a range of 0.8 to 1.2; or a ratio of a distance between the orthographic projection of the intersection of the first inclined sub-surface and the second inclined sub-surface on the base substrate and one of the orthographic projections of the two adjacent second signal lines on the base substrate in the first direction, to a distance between the orthographic projection of the intersection of the first inclined sub-surface and the second inclined sub-surface on the base substrate and the other of the orthographic projections of the two adjacent second signal lines on the base substrate in the first direction is within a range of 0.8 to 1.2.

According to some exemplary embodiments, a straight line extending along the first signal line and a straight line extending along the second signal line intersect at a first intersection point, and an orthographic projection of an intersection of the third inclined sub-surface and the fourth inclined sub-surface on the base substrate at least partially overlaps with an orthographic projection of the first intersection point on the base substrate.

According to some exemplary embodiments, a ratio of a distance between an orthographic projection of an intersection of the fifth inclined sub-surface and the sixth inclined sub-surface on the base substrate and one of the orthographic projections of the two adjacent first signal lines on the base substrate in the second direction, to a distance between the orthographic projection of the intersection of the fifth inclined sub-surface and the sixth inclined sub-surface on the base substrate and the other of the orthographic projections of the two adjacent first signal lines on the base substrate in the second direction is within a range of 0.8 to 1.2; or a ratio of a distance between the orthographic projection of the intersection of the fifth inclined sub-surface and the sixth inclined sub-surface on the base substrate and one of the orthographic projections of the two adjacent second signal lines on the base substrate in the first direction, to a distance between the orthographic projection of the intersection of the fifth inclined sub-surface and the sixth inclined sub-surface on the base substrate and the other of the orthographic projections of the two adjacent second signal lines on the base substrate in the first direction is within a range of 0.8 to 1.2.

According to some exemplary embodiments, the plurality of sub-pixels include a second sub-pixel and a third sub-pixel, and an orthographic projection of a first electrode of a light emitting device of at least one of the second sub-pixel and the third sub-pixel on the base substrate does not overlap with an orthographic projection of the plurality of signal lines on the base substrate, so that a surface of the first electrode of at least one of the second sub-pixel and the third sub-pixel away from the base substrate includes a flat surface extending parallel to the first surface from an edge of the first electrode to a center of the first electrode.

According to some exemplary embodiments, an inclination angle of the first inclined sub-surface with respect to the first surface and an inclination angle of the second inclined sub-surface with respect to the first surface are greater than 0° and less than or equal to 10°; and/or an inclination angle of the third inclined sub-surface with respect to the first surface and an inclination angle of the fourth inclined sub-surface with respect to the first surface are greater than 0° and less than or equal to 10°; and/or an inclination angle of the fifth inclined sub-surface with respect to the first surface and an inclination angle of the sixth inclined sub-surface with respect to the first surface are greater than 0° and less than or equal to 10°.

According to some exemplary embodiments, the first signal line includes at least one of a dummy signal line, a driving voltage line for transmitting a driving voltage, a data line for transmitting a data signal, and a reset signal line for transmitting a reset signal; and/or the second signal line includes at least one of a dummy signal line, a gate line for transmitting a scanning signal, an initialization signal line for transmitting an initialization voltage, and a light emitting control line for transmitting a light emitting control signal.

According to some exemplary embodiments, the first signal line and the second signal line are located in a same layer; or the first signal line and the second signal line are respectively located in two adjacent conductive layers; or at least one of the first signal line and the second signal line includes two portions, one of the two portions is located in one of two adjacent conductive layers, and the other of the two portions is located in the other of the two adjacent conductive layers.

According to some exemplary embodiments, the light emitting device includes a top-emitting organic light emitting device, and the first electrode is an anode of the organic light emitting device.

According to some exemplary embodiments, the first sub-pixel is a sub-pixel emitting blue light, the second sub-pixel is a sub-pixel emitting red light, and the third sub-pixel is a sub-pixel emitting green light.

In another aspect, there is provided a display panel including the display substrate described above.

BRIEF DESCRIPTION OF THE DRAWINGS

Exemplary embodiments of the present disclosure are described in detail with reference to the drawings, through which features and advantages of the present disclosure will become more apparent.

DETAILED DESCRIPTION OF EMBODIMENTS

Figure 1:
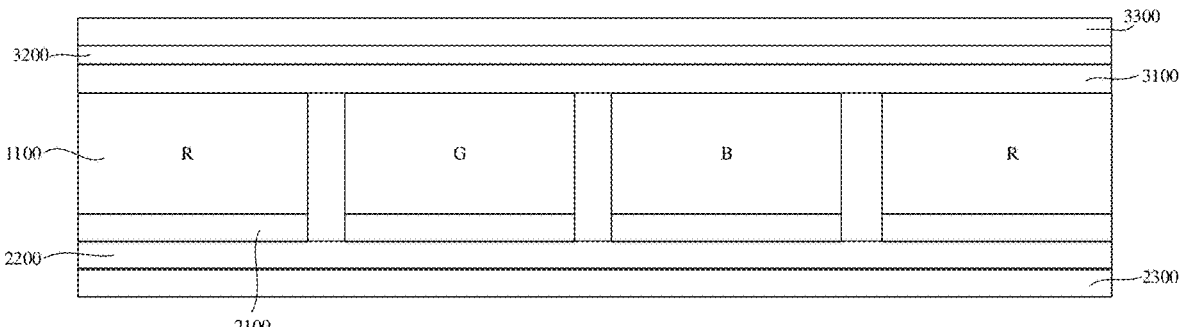
FIG. 1 is a schematic diagram of an organic electroluminescent device.

In order to make objectives, technical solutions and advantages of the present disclosure more clear, technical solutions of the embodiments of the present disclosure are clearly and completely described below with reference to the drawings. Obviously, the described embodiments are only a part but not all of the embodiments of the present disclosure. Based on the embodiments of the present disclosure described, all other embodiments obtained by those ordinary skilled in the art without carrying out inventive effort fall within the protection scope of the present disclosure.

It should be noted that, in the drawings, for clarity and/or description, sizes and relative size of elements may be enlarged. Accordingly, a size and a relative size of each element are not necessarily limited to the size and the relative size shown in the drawings. In the specification and drawings, the same or similar reference numerals indicate the same or similar components.

When an element is described as being "on", "connected to" or "coupled to" another element, the element may be directly on the another element, directly connected to the another element, or directly coupled to the another element, or an intermediate element may be present. However, when an element is described as being "directly on", "directly connected to" or "directly coupled to" another element, no intermediate element is provided. Other terms and/or expressions used to describe a relationship between elements, for example, "between" and "directly between", "adjacent" and "directly adjacent", "on" and "directly on", and so on, should be interpreted in a similar manner. In addition, the term "connected" may refer to a physical connection, an electrical connection, a communication connection, and/or a fluid connection. In addition, X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other. For the objective of the present disclosure, "at least one of X, Y and Z" and "at least one selected from a group consisting of X, Y and Z" may be interpreted as only X, only Y, only Z, or any combination of two or more of X, Y and Z, such as XYZ, XY, YZ and XZ. As used herein, the term "and/or" includes any and all combinations of one or more of the listed related items.

It should be noted that although terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from teachings of the present disclosure.

For ease of description, spatial relationship terms, such as "upper", "lower", "left", "right", may be used herein to describe a relationship between one element or feature and another element or feature as shown in the drawing. It should be understood that the spatial relationship terms are intended to cover other different orientations of the device in use or operation in addition to orientations described in the drawing. For example, if the device in the drawing is turned upside down, an element or feature described as "below" or "under" another element or feature will be oriented "above" or "on" the another element or feature.

In the present disclosure, terms "substantially", "basically", "about", "approximately" and other similar terms are used as terms of approximation rather than as terms of degree, and they are intended to explain an inherent deviation of a measured or calculated value that will be recognized by those ordinary skilled in the art. Taking into account process fluctuation, measurement problems, and errors related to measurement of specific quantities (that is, limitations of a measurement system), the terms "substantially" or "about" includes the stated value, and means that the specific value determined by those ordinary skilled in the art is within an acceptable range of deviation. For example, "about" may mean within one or more deviations, or within ±30%, ±20%, ±10% or ±5% of the stated value.

It should be noted that the expression "same layer" refers to a layer structure formed by first using a same film forming process to form a film layer for forming a specific pattern, and then using a same mask to pattern the film layer by using one-time patterning process. Depending on different specific patterns, the one-time patterning process may include a plurality of exposure, development or etching processes, and the specific patterns in the layer structure formed may be continuous or discontinuous. That is to say, a plurality of elements, components, structures and/or parts located in the "same layer" are made of a same material and formed by the same patterning process. Generally, the plurality of elements, components, structures and/or parts located in the "same layer" have a substantially same thickness.

Those skilled in the art should understand that in the present disclosure, unless otherwise specified, the expression "height" or "thickness" refers to a size of a surface of each film layer arranged perpendicular to the display substrate, that is, a size in a light emitting direction of the display substrate, or may be referred as a size in a normal direction of the display device.

FIG. 1 is a schematic diagram of an organic electroluminescent device. As shown in FIG. 1, the organic electroluminescent device may include a plurality of light emitting regions 1100 arranged in an array. Colors in the light emitting regions may include red, green and blue, denoted by R, G and B, respectively. Each light emitting region 1100 may be provided with a corresponding light emitting layer. For example, a hole transport layer 2100 and an electron transport layer 3100 are schematically shown in FIG. 1. It should be understood that the light emitting layer may further include other film layers such as a hole injection layer, a luminescent material layer and an electron injection layer, etc. The hole transport layer 2100, an anode 2200 and a reflective layer 2300 are sequentially arranged on one side of the light emitting layer; and the electron transport layer 3100, a cathode 3200 and a transflective layer 3300 are sequentially arranged on the other side of the light emitting layer. That is, FIG. 1 shows a top-emitting light emitting device. In this way, the reflective layer, the transflective layer, and the layer structure between the reflective layer and the transflective layer form a microcavity structure.

In OLED display technology, each RGB sub-pixel may include the organic electroluminescent device described above. Under a positive viewing angle, a Gamma regulation may be performed for a white picture, and a luminance ratio of RGB may be adjusted by an electric signal, so as to regulate a white balance. As the viewing angle of human eyes increases, since the RGB sub-pixels have respective optical interference cavities of different structures, the luminance ratio of the RGB sub-pixels under a large viewing angle may change with an increase of the viewing angle, so that color coordinates of the white picture under the large viewing angle may deviate from color coordinates under the positive viewing angle, which results in a color shift under the large viewing angle.

For such a color shift under the large viewing angle, different manufacturers have respective control specifications. An overall idea is to take into account both a color shift specification control and a visual effect control under the large viewing angle. For example, color shift characteristics under the large viewing angle may be improved by changing an OLED device structure. However, after a mass-production of an OLED material system is completed, in order to take into account other optical characteristics such as power consumption, lifetime and low grayscale, space to improve the color shift under the large viewing angle by adjusting the OLED device structure is limited. Therefore, a new strategy is needed to be developed to optimize a color shift trajectory under the large viewing angle.

The embodiments of the present disclosure provide at least a display substrate, including a base substrate including a first surface, a plurality of sub-pixels arranged on the first surface of the base substrate, and a plurality of signal lines arranged on the base substrate. The plurality of sub-pixels are arranged on the base substrate in an array in a first direction and a second direction. The sub-pixel includes a light emitting device and a pixel driving circuit for driving the light emitting device. The light emitting device includes a first electrode, and the pixel driving circuit includes a plurality of transistors including a source electrode and a drain electrode. The plurality of signal lines are located in the same layer as the source electrode and the drain electrode of the transistor. In some embodiments, the plurality of signal lines may be located in a different layer from the source electrode and the drain electrode of the transistor, for example, in a layer on a side of the source electrode and the drain electrode of the transistor close to the first electrode. The plurality of signal lines may include at least a first signal line extending in a first direction. Two adjacent first signal lines are spaced apart in a second direction intersecting the first direction. The plurality of sub-pixels may include a first sub-pixel. The first electrode of the light emitting device of the first sub-pixel includes two first side edge portions oppositely arranged in the second direction. Orthographic projections of the two first side edge portions of the first electrode of the first sub-pixel on the base substrate partially overlap with orthographic projections of two adjacent first signal lines on the base substrate, respectively, so that a surface of the first electrode of the first sub-pixel away from the base substrate includes a first inclined surface gradually recessed toward the first surface in a direction from an edge of the first electrode to a center of the first electrode. The display substrate according to the embodiments of the present disclosure may be implemented to improve the color shift problem of the white picture under the large viewing angle.

Figure 2A:
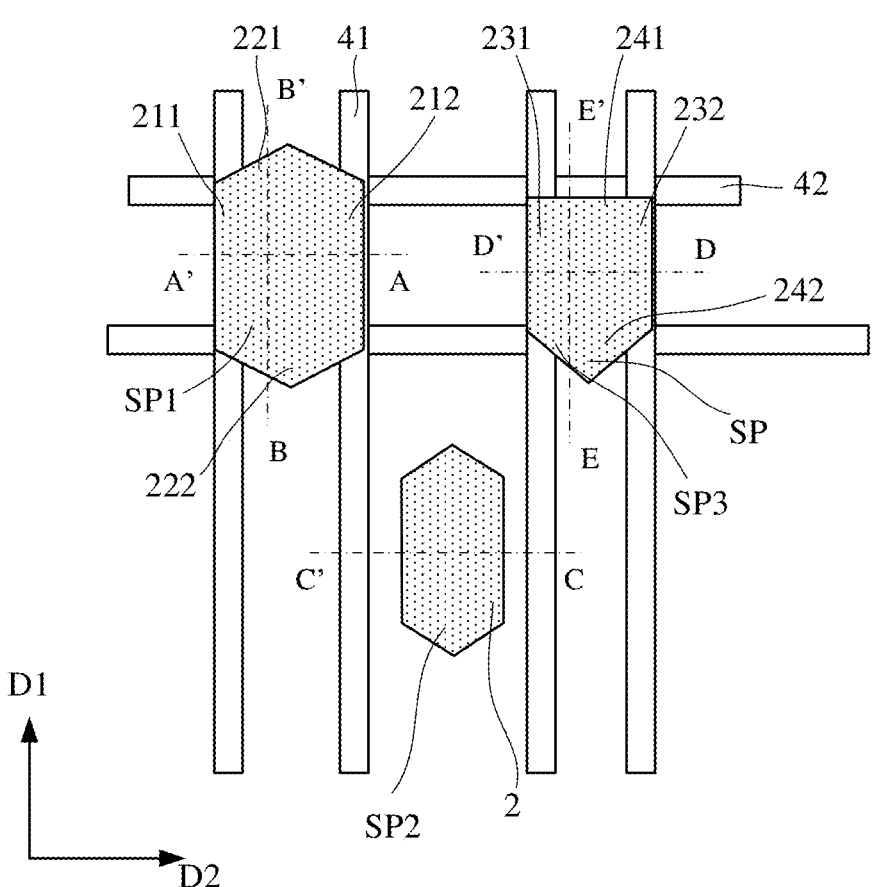
FIG. 2A is a partial plan view of a display substrate according to some exemplary embodiments of the present disclosure.
Figure 3:
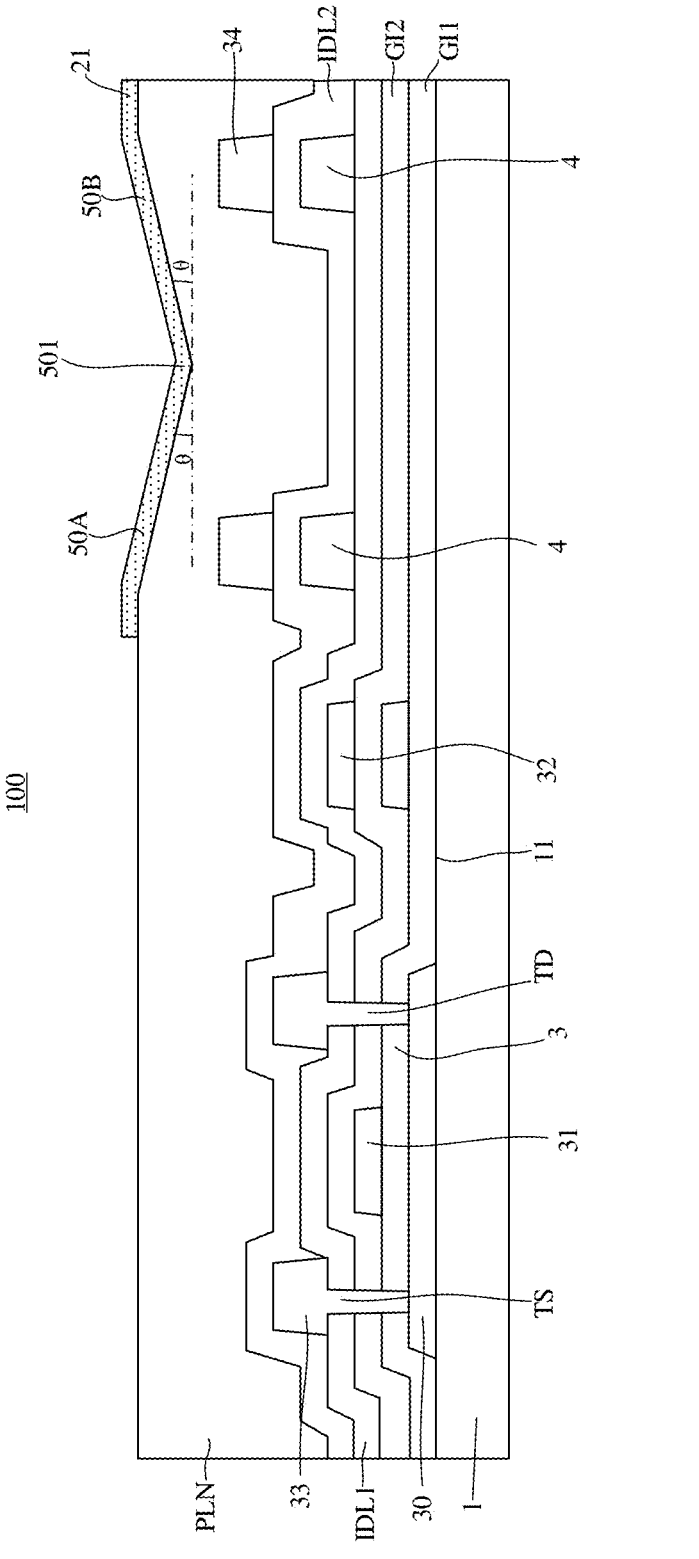
FIG. 3 is a cross-sectional view of the display substrate according to some exemplary embodiments of the present disclosure taken along line AA' or line BB' in FIG. 2A.

FIG. 2A is a partial plan view of a display substrate according to some exemplary embodiments of the present disclosure. FIG. 3 is a cross-sectional view of the display substrate according to some exemplary embodiments of the present disclosure taken along line AA' or line BB' in FIG. 2A.

Referring to FIG. 2A and FIG. 3 in combination, a display substrate 100 according to the embodiments of the present disclosure may include a base substrate 1 including a first surface 11, a plurality of sub-pixels SP arranged on the first surface 11 of the base substrate 1 in an array in a first direction D1 and a second direction D2, and a plurality of signal lines 4 arranged on the base substrate 1. The sub-pixel SP may include a light emitting device 2 and a pixel driving circuit 3 for driving the light emitting device 2. The light emitting device 2 may include a first electrode 21. The pixel driving circuit 3 may include a plurality of transistors including a source electrode TS and a drain electrode TD. The plurality of signal lines 4 are located in the same layer as the source electrode TS and the drain electrode TD of the transistor T.

It should be understood that in the embodiments of the present disclosure, referring to FIG. 2A, the display substrate 100 may further include a pixel defining layer located on a side of the first electrode (e.g., an anode) away from the pixel driving circuit. The pixel defining layer may include a plurality of openings, and each sub-pixel may correspond to at least one (for example, one) opening of the pixel defining layer. The display substrate 100 may further include a luminescent material layer arranged on the first electrode and located at least partially in the opening, and a second electrode (for example, a cathode) arranged on the luminescent material layer. In some embodiments, an area of the opening of the pixel defining layer or an actual light emitting region corresponding to each sub-pixel is less than an area of the first electrode (for example, the anode), and a projection of the opening of the pixel defining layer or the actual light emitting region on the base substrate completely falls within a projection of the first electrode on the base substrate. For ease of illustration, in the embodiments of the present disclosure, only an approximate position and shape of the first electrode (for example, the anode) of the sub-pixel are shown to represent a distribution of each sub-pixel.

In some embodiments of the present disclosure, the plurality of signal lines 4 may include at least a first signal line 41 extending in the first direction D1. Two adjacent first signal lines 41 are spaced apart in the second direction D2. The first direction D1 and the second direction D2 intersect with each other. For example, the first direction D1 and the second direction D2 may be perpendicular to each other.

The plurality of sub-pixels SP may include a first sub-pixel SP1. The first electrode 21 of the light emitting device 2 of the first sub-pixel SP1 may include two first side edge portions 211 and 212 oppositely arranged in the second direction D2. Orthographic projections of the two first side edge portions 211 and 212 of the first electrode of the first sub-pixel on the base substrate 1 partially overlap with orthographic projections of two adjacent first signal lines 41 on the base substrate 1, respectively, so that a surface (an upper surface shown in FIG. 3) of the first electrode 21 of the first sub-pixel away from the base substrate 1 includes a first inclined surface recessed toward the first surface 11 in a direction from an edge of the first electrode 21 to a center of the first electrode 21 (a concave surface shown in FIG. 3).

That is, at least two opposite side edge portions of the first electrode 21 of the first sub-pixel SP1 are arranged above the signal line 4, so that the first electrode 21 is formed into a structure with two high sides and a low middle, that is, the first electrode 21 has a concave surface structure.

Herein, unless otherwise specified, the "side edge portion" of the first electrode includes a portion of the first electrode extending from the edge of the first electrode to the center of the first electrode, an area of which occupies about ⅓ of an entire area of the first electrode. For example, in a certain direction (for example, the first direction or the second direction), the first electrode may include two side edge portions oppositely arranged in the direction and a middle portion located between the two side edge portions, and an area of each of the two side edge portions and the middle portion occupies about ⅓ of the entire area of the first electrode.

It should be noted that herein, the expression "inclined surface" may include a flat surface, a curved surface, a combination of a plurality of flat surfaces, a combination of a flat surface and a curved surface, and so on. The curved surface may include a smoothly transitioned curved surface. For example, the inclined surface may include a flat surface inclined with respect to the first surface of the base substrate; and/or the inclined surface may include a smoothly transitioned curved surface, and a tangent plane of the curved surface at a plurality of positions is inclined with respect to the first surface of the base substrate.

Figure 14:
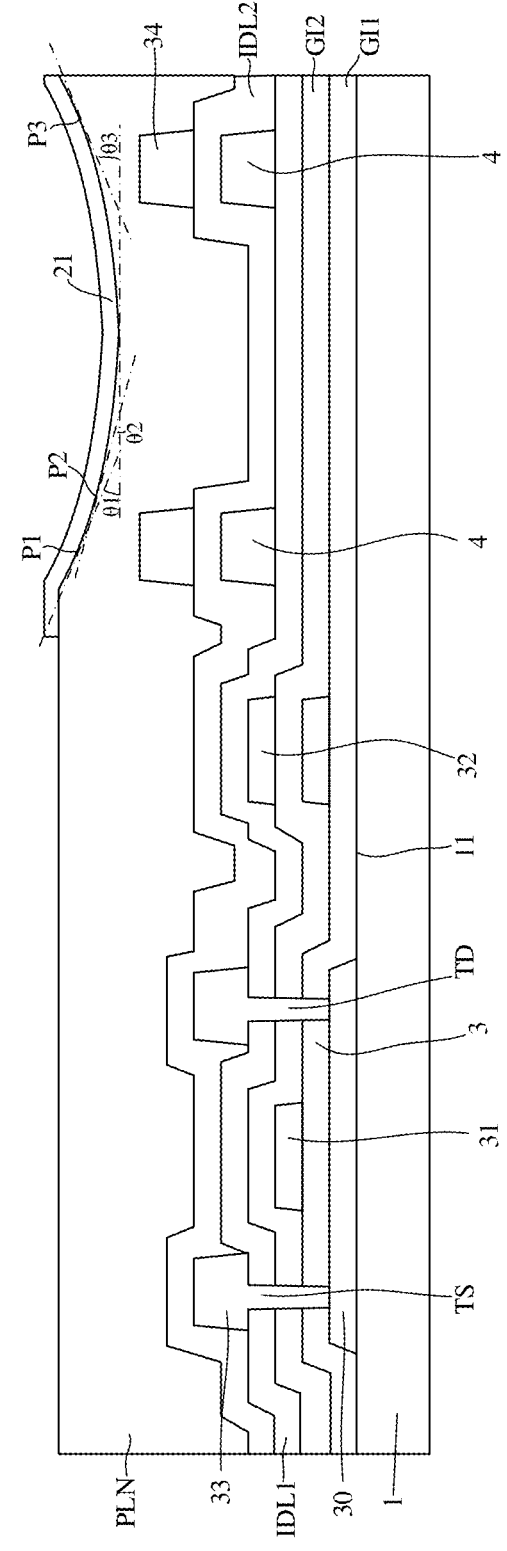
FIG. 14 is a cross-sectional view of the display substrate according to some exemplary embodiments of the present disclosure taken along line AA' or line BB' in FIG. 2A.

For example, referring to FIG. 14, a surface of the first electrode 21 away from the base substrate 1 is formed as a first inclined surface, which is a concave and smoothly transitioned curved surface structure. A tangent plane of the smoothly transitioned curved surface at each position is inclined with respect to the first surface 11, that is, forms a certain angle with the first surface 11. For example, tangent planes at positions P1, P2 and P3 are schematically shown in FIG. 14, which form angles θ1, θ2 and θ3 with the first surface 11, respectively. Exemplarily, an included angle between the tangent plane at each position of the smoothly transitioned curved surface and the first surface 11 is within a range of 0° to 20°, for example, within a range of 0° to 10°.

In some embodiments, the plurality of signal lines may further include a second signal line 42 extending in the second direction D2. The first electrode 21 of the light emitting device 2 of the first sub-pixel SP1 includes two second side edge portions 221 and 222 oppositely arranged in the first direction D1. Orthographic projections of the two second side edge portions 221 and 222 of the first electrode of the first sub-pixel on the base substrate partially overlap with orthographic projections of two adjacent second signal lines 42 on the base substrate 1, respectively. That is, four side edge portions of the first electrode 21 of the first sub-pixel SP1 are arranged above the signal line 4, so that the first electrode 21 is formed into a structure with four high sides and a low middle, that is, the first electrode 21 has a concave surface structure.

Continuing to refer to FIG. 3, the display substrate may include a base substrate 1 and a plurality of film layers arranged on the base substrate 1. In some embodiments, the plurality of film layers include at least a semiconductor layer 30, a first conductive layer 31, a second conductive layer 32, a third conductive layer 33 and a fourth conductive layer 34 that are sequentially arranged away from the base substrate 1. The plurality of film layers may further include at least a plurality of insulating film layers which may include, for example, a first gate insulating layer GI1, a second gate insulating layer GI2, a first interlayer insulating layer IDL1 and a second interlayer insulating layer IDL2. The first gate insulating layer GI1 may be arranged between the semiconductor layer 30 and the first conductive layer 31, the second gate insulating layer GI2 may be arranged between the first conductive layer 31 and the second conductive layer 32, the first interlayer insulating layer IDL1 may be arranged between the second conductive layer 32 and the third conductive layer 33, and the second interlayer insulating layer IDL2 may be arranged between the third conductive layer 33 and the fourth conductive layer 34.

For example, an active layer of the transistor may be located in the semiconductor layer 30. The gate electrode of the transistor may be located in the first conductive layer 31. The pixel driving circuit 3 may include a storage capacitor including a first storage capacitor electrode and a second storage capacitor electrode oppositely arranged. The first storage capacitor electrode may be located in the first conductive layer 31, and the second storage capacitor electrode may be located in the second conductive layer 32.

For example, the semiconductor layer 30 may be formed of a semiconductor material such as low-temperature polysilicon, and may have a film layer thickness in a range of 400 angstroms to 800 angstroms, such as 500 angstroms. The first conductive layer 31 and the second conductive layer 32 may be formed of a conductive material that forms the gate electrode of the thin film transistor, the conductive material may be Mo, for example. The first conductive layer 21 and the second conductive layer 22 may have a film layer thickness in a range of 2000 angstroms to 4000 angstroms, such as 3000 angstroms. The third conductive layer 33 and the fourth conductive layer 34 may be formed of a conductive material that forms the source electrode and the drain electrode of the thin film transistor, the conductive material may contain Ti, Al, etc., for example. The third conductive layer 33 may have a stacked structure formed of Ti/Al/Ti, and have a film layer thickness in a range of 6000 angstroms to 9000 angstroms. For example, in a case that the third conductive layer 33 or the fourth conductive layer 34 has the stacked structure formed of Ti/Al/Ti, each layer of the Ti/Al/Ti layers may has a thickness of about 500 angstroms, 6000 angstroms and 500 angstroms. For example, the first gate insulating layer GI1 and the second gate insulating layer GI2 may be formed of silicon oxide, silicon nitride, or silicon oxynitride, and each layer may have a thickness of about 1000 angstroms to 2000 angstroms. For example, the first interlayer insulating layer IDL1 and the second interlayer insulating layer IDL2 may be formed of silicon oxide, silicon nitride, or silicon oxynitride, and may have a thickness of about 3000 angstroms to 6000 angstroms.

In the embodiments of the present disclosure, the first electrode 21 of the light emitting device 2 may be an anode. The plurality of insulating film layers may further include a planarization layer PLN arranged between the fourth conductive layer 34 and a layer where the first electrode 21 is located.

Figure 4:
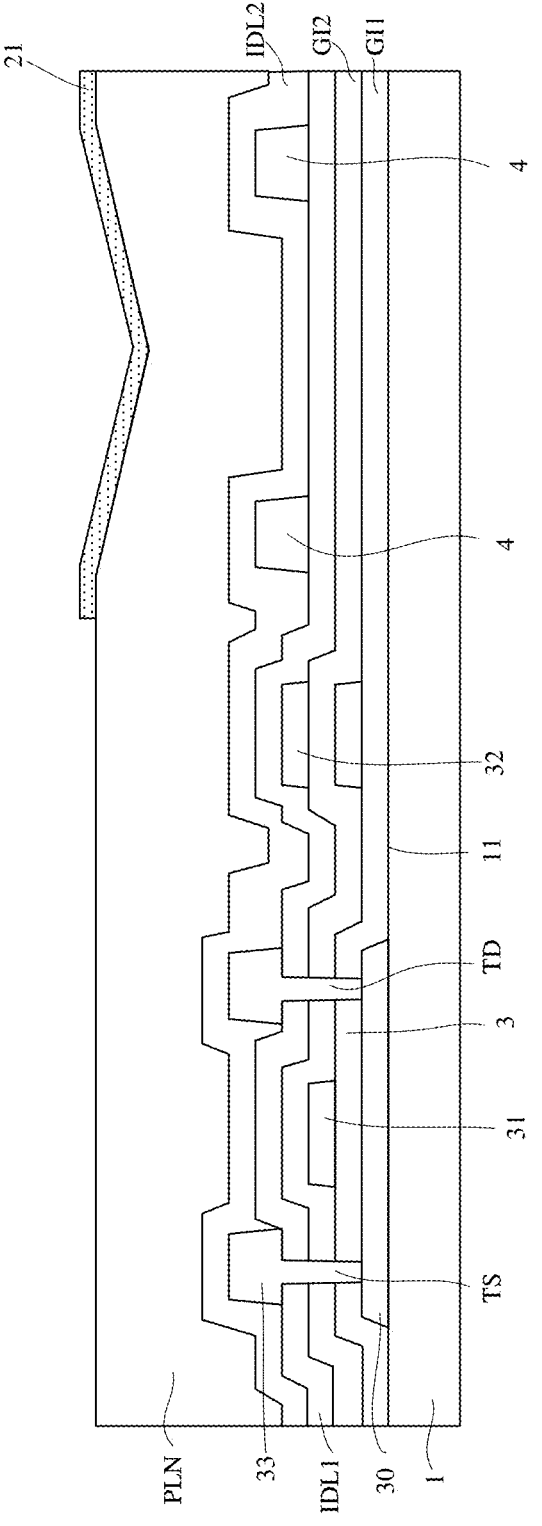
FIG. 4 is a cross-sectional view of the display substrate according to some exemplary embodiments of the present disclosure taken along line AA' or line BB' in FIG. 2A.

For example, the signal line 4 may be located in at least one of the third conductive layer 33 and the fourth conductive layer 34. In the embodiment of FIG. 3, the signal line 4 is located in the third conductive layer 33 and the fourth conductive layer 34. That is, the signal line 4 is routed in two conductive layers 33 and 34. In this way, a resistance of the signal line 4 may be reduced, which is beneficial to improve a uniformity of the display substrate. However, the embodiments of the present disclosure are not limited to this. For example, FIG. 4 is a cross-sectional view of the display substrate according to some exemplary embodiments of the present disclosure taken along line AA' or line BB' in FIG.

2A. Referring to FIG. 4, the signal line 4 is located in the third conductive layer 33, that is, the signal line 4 is routed in one conductive layer 33.

In the embodiments of the present disclosure, since the third conductive layer 33 and the fourth conductive layer 34 have a large thickness, the signal line 4 located in at least one of the third conductive layer 33 and the fourth conductive layer 34 also has a large thickness. In this way, when the side edge portions of the first electrode 21 of the first sub-pixel SP1 are arranged above the signal line 4, it is advantageous to form the first electrode 21 into a structure with two high sides and a low middle, that is, into a concave surface structure. Specifically, even if the planarization layer PLN is arranged between the fourth conductive layer 34 and the layer where the first electrode 21 is located, a surface of the planarization layer PLN away from the surface of the base substrate 1 is stilled formed into a concave structure because the signal line 4 has a large thickness.

Figure 5:
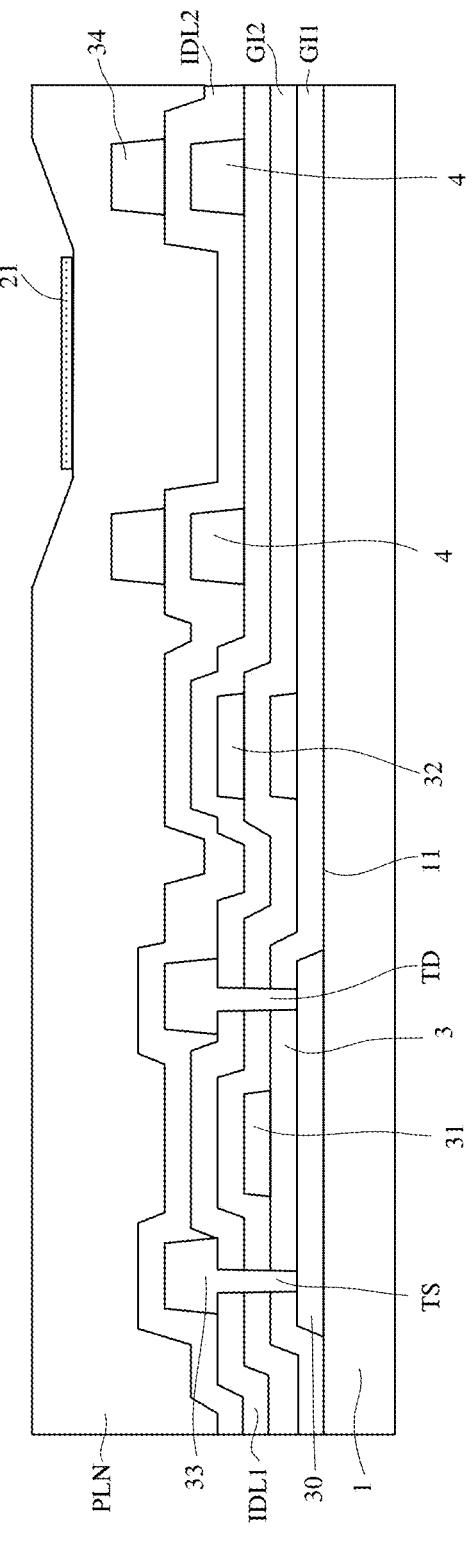
FIG. 5 is a cross-sectional view of the display substrate according to some exemplary embodiments of the present disclosure taken along line CC' in FIG. 2A.

FIG. 5 shows a cross-sectional view of the display substrate according to some exemplary embodiments of the present disclosure taken along line CC' in FIG. 2A. Referring to FIG. 2A and FIG. 5, the plurality of sub-pixels SP may include a second sub-pixel SP2. An orthographic projection of the first electrode 21 of the light emitting device of the second sub-pixel SP2 on the base substrate 1 does not overlap with an orthographic projection of the plurality of signal lines 4 on the base substrate 1, so that a surface of the first electrode 21 of the second sub-pixel SP2 away from the base substrate 1 includes a flat surface extending parallel to the first surface 11 from the edge of the first electrode 21 to the center of the first electrode 21. In other words, the anode of the light emitting device of the second sub-pixel SP2 is not arranged above the signal line 4, and an orthographic projection of the anode of the light emitting device of the second sub-pixel SP2 on the base substrate 1 is located in a region between the signal lines 4. In this way, an upper surface of the first electrode 21 may be formed into a flat surface.

Figure 6:
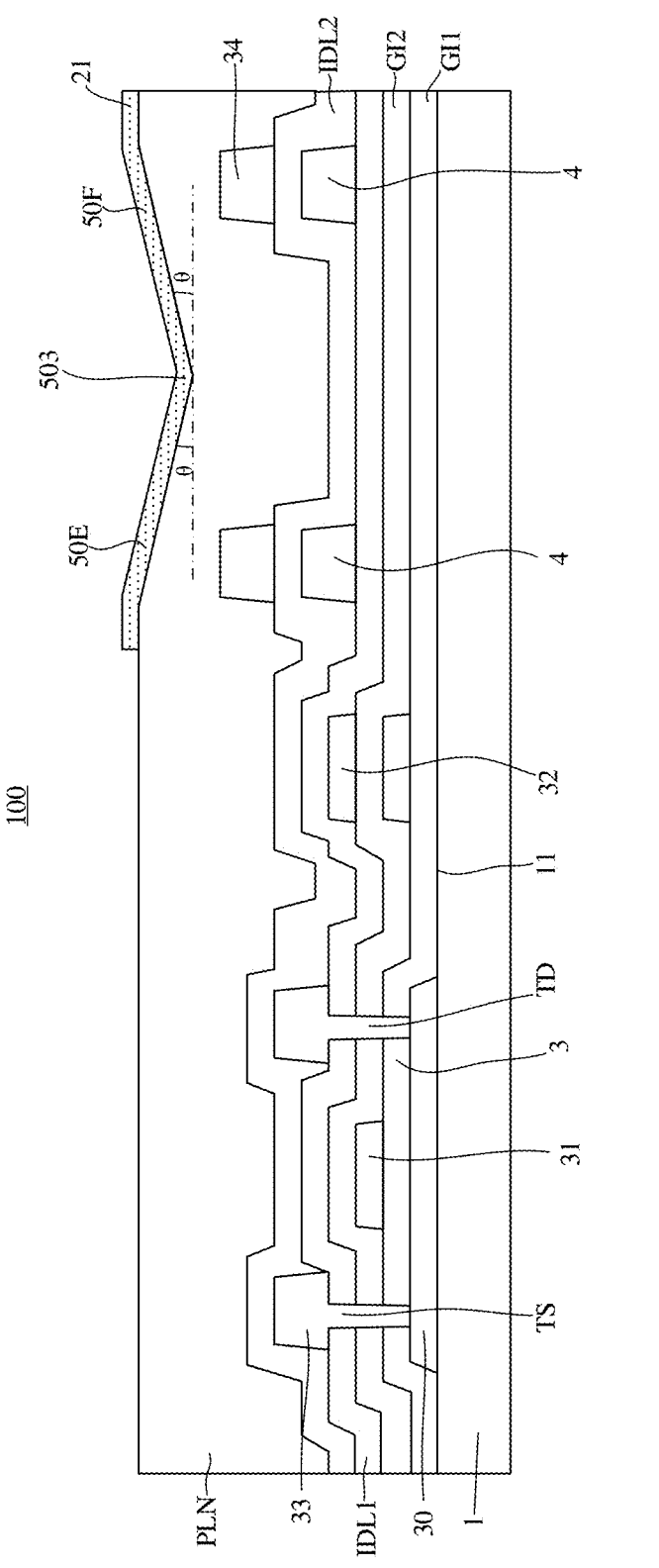
FIG. 6 is a cross-sectional view of the display substrate according to some exemplary embodiments of the present disclosure taken along line DD' or line EE' in FIG. 2A.

FIG. 6 is a cross-sectional view of the display substrate according to some exemplary embodiments of the present disclosure taken along line DD' or line EE' in FIG. 2A. Referring to FIG. 2A and FIG. 6, the plurality of sub-pixels SP may include a third sub-pixel SP3. The first electrode 21 of the light emitting device 2 of the third sub-pixel SP3 may include two third side edge portions 231 and 232 oppositely arranged in the second direction D2. Orthographic projections of the two third side edge portions 231 and 232 of the first electrode 21 of the third sub-pixel SP3 on the base substrate 1 partially overlap with orthographic projections of two adjacent first signal lines 41 on the base substrate 1, respectively, so that a surface of the first electrode 21 of the third sub-pixel SP3 away from the base substrate 1 includes a third inclined surface recessed toward the first surface 11 in a direction from an edge of the first electrode 21 to a center of the first electrode 21 (a concave surface shown in FIG. 6). In other words, at least two opposite side edge portions of the first electrode 21 of the third sub-pixel SP3 are arranged above the signal line 4, so that the first electrode 21 is formed into a structure with two high sides and a low middle, that is, the first electrode 21 has a concave surface structure.

In some embodiments, the first electrode 21 of the light emitting device 2 of the third sub-pixel SP3 includes two fourth side edge portions 241 and 242 oppositely arranged in the first direction D1. Orthographic projections of the two fourth side edge portions 241 and 242 of the first electrode of the third sub-pixel on the base substrate 1 partially overlap with orthographic projections of two adjacent second signal lines 42 on the base substrate 1, respectively. In other words, four side edge portions of the first electrode 21 of the third sub-pixel SP3 are arranged above the signal line 4, so that the first electrode 21 is formed into a structure with four high sides and a low middle, that is, the first electrode 21 has a concave surface structure.

For example, the first inclined surface may include a first inclined sub-surface 50A and a second inclined sub-surface 50B both inclined with respect to the first surface 11.

An orthographic projection of an intersection 501 of the first inclined sub-surface 50A and the second inclined sub-surface 50B on the base substrate 1 is located between orthographic projections of two adjacent first signal lines 41 on the base substrate 1. The orthographic projection of the intersection 501 of the first inclined sub-surface 50A and the second inclined sub-surface 50B on the base substrate 1 may be further located between orthographic projections of two adjacent second signal lines 42 on the base substrate 1.

It should be noted that herein, unless otherwise specified, the "intersection" of two inclined sub-surfaces may be understood as a portion where an inclination direction changes, or a portion where a slope corresponding to the inclined surface has an inflection point. A ratio of a distance between the orthographic projection of the intersection 501 of the first inclined sub-surface 50A and the second inclined sub-surface 50B on the base substrate 1 and one of orthographic projections of the two adjacent first signal lines 41 on the base substrate 1 in the second direction D2, to a distance between the orthographic projection of the intersection 501 of the first inclined sub-surface 50A and the second inclined sub-surface 50B on the base substrate 1 and the other one of the orthographic projections of the two adjacent first signal lines 41 on the base substrate 1 in the second direction D2 is within a range of 0.8 to 1.2. That is, the two distances are substantially equal. A ratio of a distance between the orthographic projection of the intersection 501 of the first inclined sub-surface 50A and the second inclined sub-surface 50B on the base substrate 1 and one of orthographic projections of the two adjacent second signal lines 42 on the base substrate 1 in the first direction D1, to a distance between the orthographic projection of the intersection 501 of the first inclined sub-surface 50A and the second inclined sub-surface 50B on the base substrate 1 and the other one of the orthographic projections of the two adjacent second signal lines 42 on the base substrate 1 in the first direction D1 is within a range of 0.8 to 1.2. That is, the two distances are substantially equal.

In the embodiments of the present disclosure, an inclination angle θ of the first inclined sub-surface 50A with respect to the first surface 11 and an inclination angle θ of the second inclined sub-surface 50B with respect to the first surface 11 are greater than 0° and less than or equal to 20°, for example, greater than 0° and less than or equal to 10°, or greater than 0° and less than or equal to 5°.

Similarly, in the embodiments of the present disclosure, the third inclined surface may include a fifth inclined sub-surface 50E and a sixth inclined sub-surface 50F both inclined with respect to the first surface 11.

An orthographic projection of an intersection 503 of the fifth inclined sub-surface 50E and the sixth inclined sub-surface 50F on the base substrate 1 is located between the orthographic projections of the two adjacent first signal lines 41 on the base substrate 1. The orthographic projection of the intersection 503 of the fifth inclined sub-surface 50E and the sixth inclined sub-surface 50F on the base substrate 1 is located between the orthographic projections of the two adjacent second signal lines 42 on the base substrate 1.

A ratio of a distance between the orthographic projection of the intersection 503 of the fifth inclined sub-surface 50E and the sixth inclined sub-surface 50F on the base substrate 1 and one of the orthographic projections of the two adjacent first signal lines 41 on the base substrate 1 in the second direction D2, to a distance between the orthographic projection of the intersection 503 of the fifth inclined sub-surface 50E and the sixth inclined sub-surface 50F on the base substrate 1 and the other one of the orthographic projections of the two adjacent first signal lines 41 on the base substrate 1 in the second direction D2 is within a range of 0.8 to 1.2. That is, the two distances are substantially equal. A ratio of a distance between the orthographic projection of the intersection 503 of the fifth inclined sub-surface 50E and the sixth inclined sub-surface 50F on the base substrate 1 and one of the orthographic projections of the two adjacent second signal lines 42 on the base substrate 1 in the first direction D1, to a distance between the orthographic projection of the intersection 503 of the fifth inclined sub-surface 50E and the sixth inclined sub-surface 50F on the base substrate 1 and the other one of the orthographic projections of the two adjacent second signal lines 42 on the base substrate 1 in the first direction D1 is within a range of 0.8 to 1.2. That is, the two distances are substantially equal.

In the embodiments of the present disclosure, an inclination angle θ of the fifth inclined sub-surface 50E with respect to the first surface 11 and an inclination angle θ of the sixth inclined sub-surface 50F with respect to the first surface 11 are greater than 0° and less than or equal to 20°, for example, greater than 0° and less than or equal to 10°, or greater than 0° and less than or equal to 5°.

For example, in the embodiments of the present disclosure, the first sub-pixel SP1 may be a sub-pixel emitting blue light, the second sub-pixel SP2 may be a sub-pixel emitting red light, and the third sub-pixel SP3 may be a sub-pixel emitting green light. It should be understood that the embodiments of the present disclosure are not limited to this.

In the embodiments of the present disclosure, the signal line 4 and other wiring under the first sub-pixel SP1 and the third sub-pixel SP3 are arranged around the first electrode 21 as much as possible, and the wiring under the second sub-pixel SP2 bypasses the first electrode 21, as shown in FIG. 2A. In this way, the upper surface of the first electrode of the first sub-pixel SP1 and the upper surface of the first electrode of the third sub-pixel SP3 may be formed into a concave surface, and the upper surface of the second sub-pixel SP2 may be a flat surface.

By forming the upper surface of the first electrode of the first sub-pixel SP1 and the upper surface of the first electrode of the third sub-pixel SP3 into the concave surface, a luminance decay trend of blue light and green light under a large viewing angle may be significantly affected, which may then affect a color trajectory and a color shift level of the white picture under the large viewing angle. When the surface of the first electrode 21 of the light emitting device is recessed, in a case of viewing the first sub-pixel SP1 and the third sub-pixel SP3 under a positive viewing angle, it has already formed a certain angle with respect to a surface normal direction of the first electrode 21 of the first sub-pixel SP1 and the first electrode 21 of the third sub-pixel SP3.

Figure 7A:
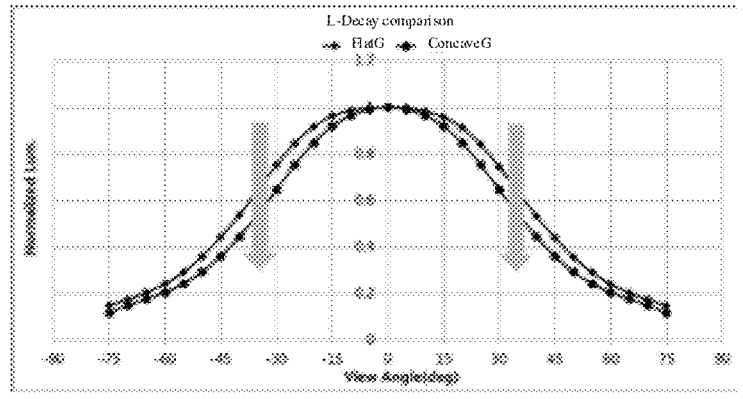
FIG. 7A schematically shows a curve diagram that shows a luminance decay of a first sub-pixel with an increase of a viewing angle in a case that a concave surface design and a flat surface design are adopted for an upper surface of a first electrode of the first sub-pixel.
Figure 7B:
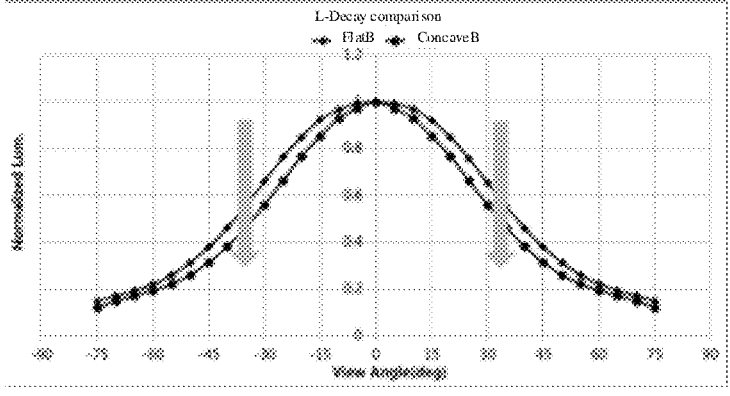
FIG. 7B schematically shows a curve diagram that shows a luminance decay of a third sub-pixel with an increase of a viewing angle in a case that a concave surface design and a flat surface design are adopted for an upper surface of a first electrode of the third sub-pixel.

FIG. 7A schematically shows a curve diagram that shows a luminance decay of a first sub-pixel with an increase of a viewing angle in a case that a concave surface design and a flat surface design are adopted for an upper surface of a first electrode of the first sub-pixel. FIG. 7B schematically shows a curve diagram that shows a luminance decay of a third sub-pixel with an increase of a viewing angle in a case that a concave surface design and a flat surface design are adopted for an upper surface of a first electrode of the third sub-pixel. In FIG. 7A and FIG. 7B, "L-Decay" represents a luminance decay, an abscissa "View Angle (deg)" represents a viewing angle (degree), and an ordinate "Normalized Lum" represents a normalized luminance.

Referring to FIG. 7A and FIG. 7B, in a case that the flat surface design is adopted for the upper surface of the first electrode of the first sub-pixel or the upper surface of the first electrode of the third sub-pixel, the luminance decay trend under a large viewing angle is fast, that is, the luminance may be significantly reduced with the increase of the viewing angle. In a case that the concave surface design is adopted for the upper surface of the first electrode of the first sub-pixel or the upper surface of the first electrode of the third sub-pixel, the luminance decay trend under the large viewing angle is slow, that is, the luminance decay trend may be decreased. In addition, since the flat surface design is adopted for the upper surface of the first electrode of the second sub-pixel, the luminance decay trend of the second sub-pixel under the large viewing angle remains unchanged. This may result in a change in the luminance decay trend of three primary colors including red, green and blue in the white picture under the large viewing angle, and then result in a change in the color shift trajectory and the color shift level of the white picture under the large viewing angle.

Figure 8A:
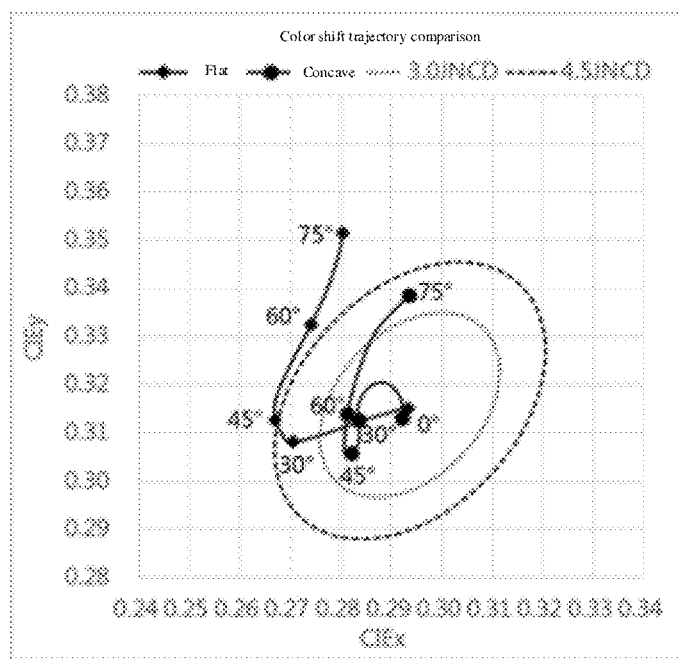
FIG. 8A schematically shows a color shift trajectory diagram of a first sub-pixel or a third sub-pixel in a case that a concave surface design and a flat surface design are adopted for an upper surface of a first electrode of the first sub-pixel or an upper surface of a first electrode of the third sub-pixel.
Figure 8B:
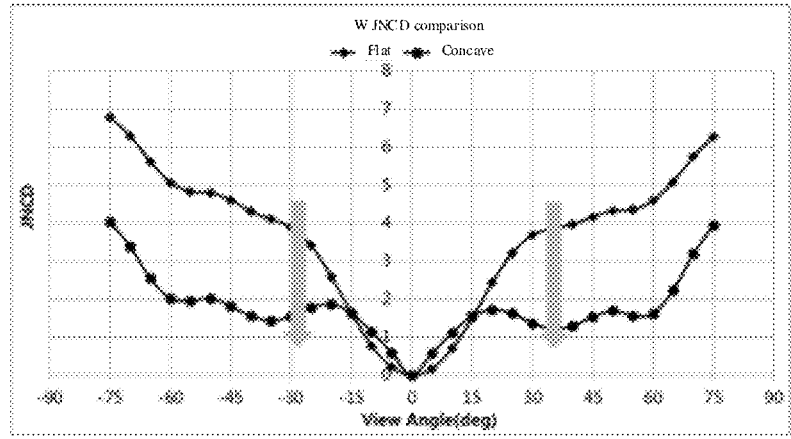
FIG. 8B schematically shows a color shift JNCD improvement effect diagram of a first sub-pixel or a third sub-pixel in a case that a concave surface design and a flat surface design are adopted for an upper surface of a first electrode of the first sub-pixel or an upper surface of a first electrode of the third sub-pixel.

FIG. 8A schematically shows a color shift trajectory diagram of a first sub-pixel or a third sub-pixel in a case that a concave surface design and a flat surface design are adopted for an upper surface of the first electrode of the first sub-pixel or an upper surface of the third sub-pixel. FIG. 8B schematically shows a color shift JNCD improvement effect diagram of a first sub-pixel or a third sub-pixel in a case that a concave surface design and a flat surface design are adopted for an upper surface of the first electrode of the first sub-pixel or an upper surface of the third sub-pixel. Table 1 schematically shows color shift JNCD improvement effect data of the first sub-pixel or the third sub-pixel in the case that the concave surface design and the flat surface design are adopted for the upper surface of the first electrode of the first sub-pixel or the upper surface of the first electrode of the third sub-pixel. Here, "JNCD" is an abbreviation for "Just Noticeable Color Difference", which is a standard for measuring an accuracy of screen colors. The smaller a value of JNCD, the more accurate a color display on the screen.

TABLE 1

| Color shift JNCD data of sub-pixel | | | |
|---|---|---|---|
| | WJNCD | | |
| Condition | 30° | 45° | 60° |
| Flat | 3.9 | 4.6 | 5.1 |
| Concave | 1.5 | 1.8 | 2.0 |

Referring to FIG. 8A, FIG. 8B and Table 1, the luminance decay trend of the first sub-pixel SP1 and the third sub-pixel SP3 under the large viewing angle is decreased, which may result in a corresponding change in a tristimulus value of the white picture under the large viewing angle. In the case that the flat surface design is adopted, the color shift trajectory of the white picture under the large viewing angle is cyan and green; in the case that the concave surface design is adopted, the color shift trajectory of the white picture under the large viewing angle is similar to an S-shape, and the color coordinates of the white picture under the large viewing angle may make an S-shaped movement around a Gamma white balance point. The S-shaped color shift trajectory of the white picture may result in a significant reduction in a deviation level of the color coordinates of the white picture under the large viewing angle. As shown in FIG. 8B and Table 1, a color shift level at 30° is reduced from 3.9 JNCD to 1.5 JNCD, a color shift level at 45° is reduced from 4.6 JNCD to 1.8 JNCD, and a color shift level at 60° is reduced from 5.1 JNCD to 2.0 JNCD.

In FIG. 2A, an orthographic projection of a main body of the first electrode of the first sub-pixel SP1 on the base substrate and an orthographic projection of a main body of the first electrode of the second sub-pixel SP2 on the base substrate are hexagons, and an orthographic projection of a main body of the first electrode of the third sub-pixel SP3 on the base substrate is a pentagon, but the embodiments of the present disclosure are not limited thereto.

Figure 2B:
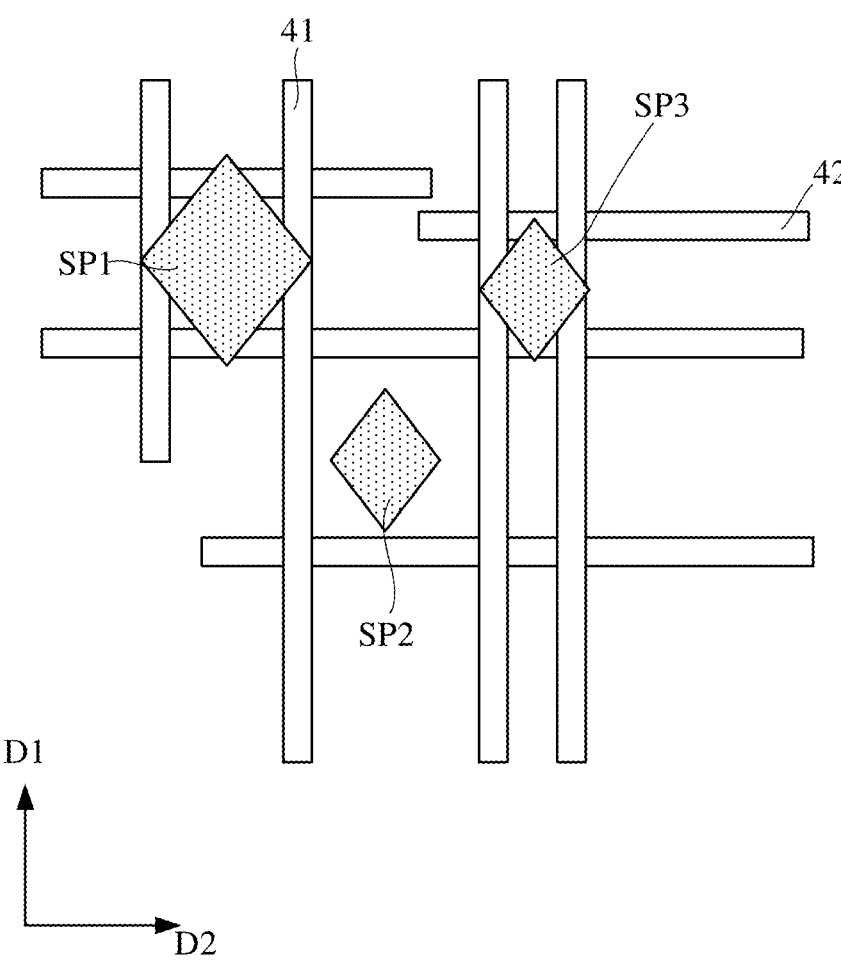
FIG. 2B and FIG. 2C are partial plan views of a display substrate according to some other exemplary embodiments of the present disclosure, respectively.
Figure 2C:
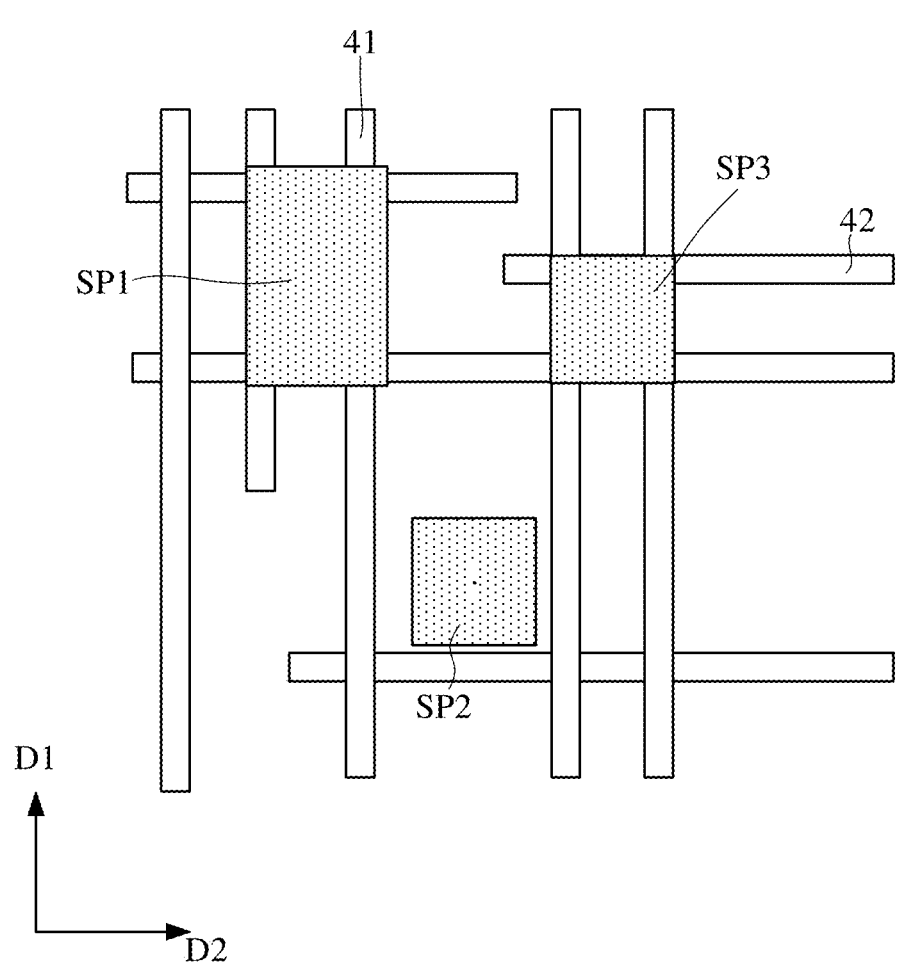

For example, FIG. 2B and FIG. 2C are partial plan views of a display substrate according to some other exemplary embodiments of the present disclosure, respectively. Referring to FIG. 2B, the orthographic projection of the main body of the first electrode of the first sub-pixel SP1 on the base substrate, the orthographic projection of the main body of the first electrode of the second sub-pixel SP2 on the base substrate and the orthographic projection of the main body of the first electrode of the third sub-pixel SP3 on the base substrate are rhombuses. Referring to FIG. 2C, the orthographic projection of the main body of the first electrode of the first sub-pixel SP1 on the base substrate, the orthographic projection of the main body of the first electrode of the second sub-pixel SP2 on the base substrate and the orthographic projection of the main body of the first electrode of the third sub-pixel SP3 on the base substrate are rectangles. It should be understood that a relative positional relationship between the first electrode and the signal line 4 shown in FIG. 2B and FIG. 2C as well as the inclined surface design of the first electrode may still refer to the design described above, which will not be repeated here.

Figure 9A:
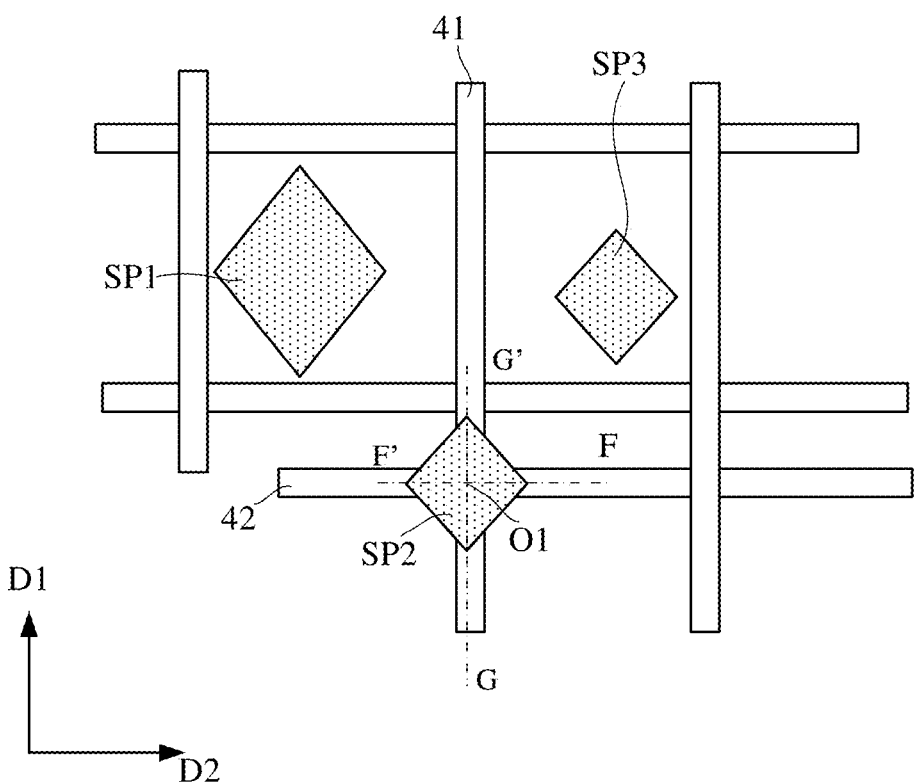
FIG. 9A is a partial plan view of a display substrate according to some exemplary embodiments of the present disclosure.
Figure 10:
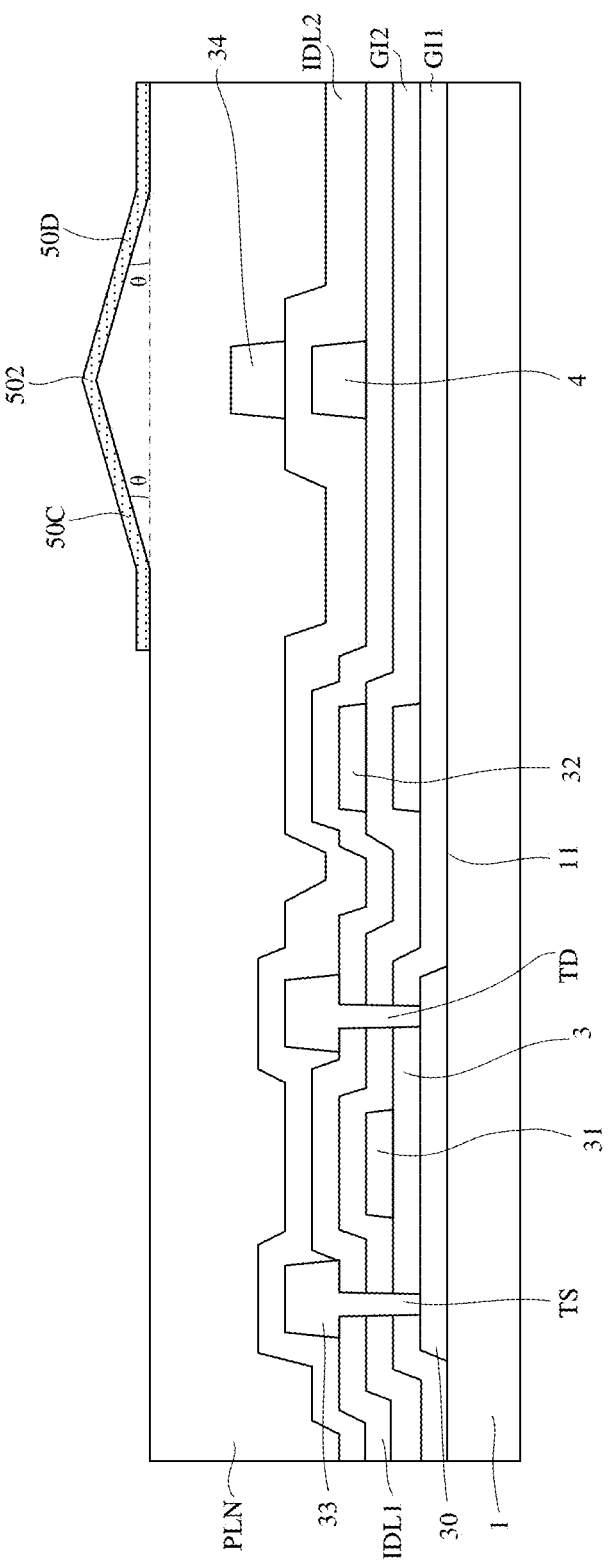
FIG. 10 is a cross-sectional view of the display substrate according to some exemplary embodiments of the present disclosure taken along line FF' or line GG' in FIG. 9A.

FIG. 9A is a partial plan view of a display substrate according to some exemplary embodiments of the present disclosure. FIG. 10 is a cross-sectional view of the display substrate according to some exemplary embodiments of the present disclosure taken along line FF' or line GG' in FIG. 9A. Referring to FIG. 9A and FIG. 10, the orthographic projection of the first electrode 21 of the light emitting device 2 of the second sub-pixel SP2 on the base substrate 1 at least partially overlaps with an orthographic projection of a first signal line 41 on the base substrate 1 and an orthographic projection of a second signal line 42 on the base substrate 1, so that a surface of the first electrode 21 of the second sub-pixel away from the base substrate 1 includes a second inclined surface (a convex surface as shown in FIG. 10) protruding away from the first surface 11 in a direction from the edge of the first electrode 21 to the center of the first electrode 21. In other words, a central portion of the first electrode 21 of the second sub-pixel SP2 is arranged above the signal line 4, so that the first electrode 21 is formed into a structure with a high middle and low sides, that is, the first electrode 21 has a convex surface structure.

It should be noted that, in the embodiments of the present disclosure, a protruded position of the "convex surface" may be located in a middle portion of the first electrode. As described above, the area of the middle portion may occupy approximately ⅓ of the entire area of the first electrode. However, the embodiments of the present disclosure are not limited to this. The protruded position of the "convex surface" may be deviated to one side, that is, it may be closer to an edge of a side of the first electrode. For example, the protruded position may be close to an edge of a side of the first electrode in the second direction, and a distance between the protruded position and the edge of the side of the first electrode in the second direction may be ¼, ⅕, ⅙, etc. of an entire size of the first electrode in the second direction.

For example, the second inclined surface may include a third inclined sub-surface 50C and a fourth inclined sub-surface 50D both inclined with respect to the first surface 11.

An orthographic projection of an intersection 502 of the third inclined sub-surface 50C and the fourth inclined sub-surface 50D on the base substrate 1 is located within the orthographic projection of the first signal line 41 on the base substrate 1. The orthographic projection of the intersection 502 of the third inclined sub-surface 50C and the fourth inclined sub-surface 50D on the base substrate 1 is located within the orthographic projection of the second signal line 42 on the base substrate 1.

For example, a straight line extending along the first signal line 41 and a straight line extending along the second signal line 42 intersect at a first intersection point O1, and the orthographic projection of the intersection 502 of the third inclined sub-surface 50C and the fourth inclined sub-surface 50D on the base substrate 1 at least partially overlaps with an orthographic projection of the first intersection point O1 on the base substrate 1.

An inclination angle θ of the third inclined sub-surface 50C with respect to the first surface 11 and an inclination angle θ of the fourth inclined sub-surface 50D with respect to the first surface 11 are greater than 0° and less than or equal to 20°, for example, greater than 0° and less than or equal to 10°, or greater than 0° and less than or equal to 5°.

In this embodiment, an orthographic projection of the first electrode of the light emitting device of at least one of the first sub-pixel and the third sub-pixel on the base substrate does not overlap with the orthographic projection of the plurality of signal lines on the base substrate, so that the surface of the first electrode of the at least one of the first sub-pixel and the third sub-pixel away from the base substrate includes a flat surface extending parallel to the first surface from the edge of the first electrode to the center of the first electrode.

Figure 11:
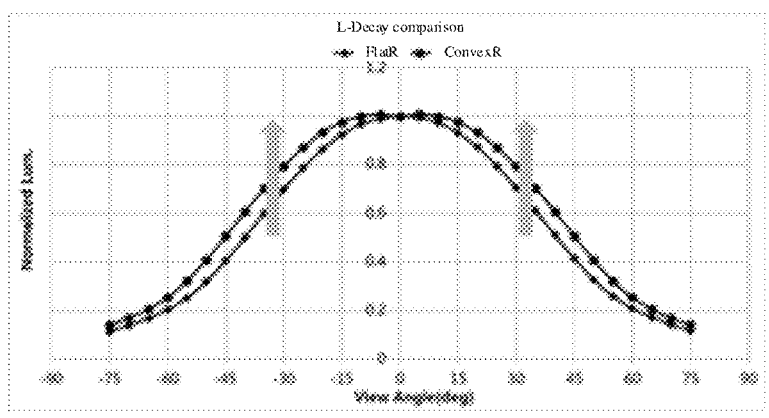
FIG. 11 schematically shows a curve diagram that shows a luminance decay of a second sub-pixel with an increase of a viewing angle in a case that a convex surface design and a flat surface design are adopted for an upper surface of a first electrode of the second sub-pixel.

FIG. 11 schematically shows a curve diagram that shows a luminance decay of a second sub-pixel with an increase of a viewing angle in a case that a convex surface design and a flat surface design are adopted for an upper surface of a first electrode of the second sub-pixel. In FIG. 11, "L-Decay" represents a luminance decay, an abscissa "View Angle (deg)" represents the viewing angle (degree), and an ordinate "Normalized Lum" represents a normalized luminance.

Referring to FIG. 11, compared with the flat surface design, when the convex surface design is adopted for the upper surface of the first electrode of the second sub-pixel, a significant pulling effect is generated on the luminance decay trend under the large viewing angle. Moreover, as the viewing angle increases, the luminance of the second sub-pixel under the large viewing angle firstly increases at a small angle, and then decreases at a large angle. The luminance decay trend of the first sub-pixel and the third sub-pixel under the large viewing angle remain unchanged, so that the luminance decay trend of the red, green and blue primary colors of the white picture under the large viewing angle changes, which may result in a change in the color shift trajectory and the deviation level of the color coordinates of the white picture under the large viewing angle.

Figure 12A:
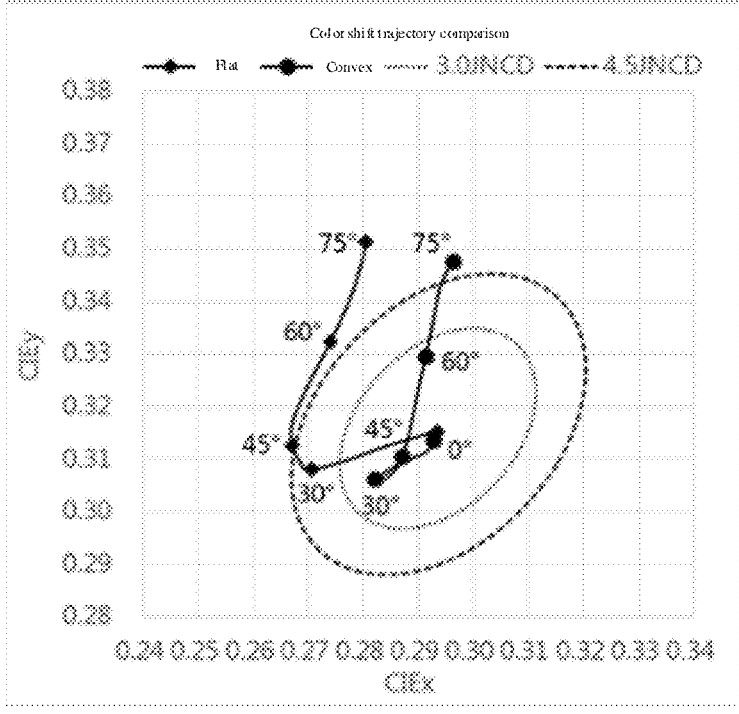
FIG. 12A schematically shows a color shift trajectory diagram of a second sub-pixel in a case that a convex surface design and a flat surface design are adopted for an upper surface of a first electrode of the second sub-pixel.
Figure 12B:
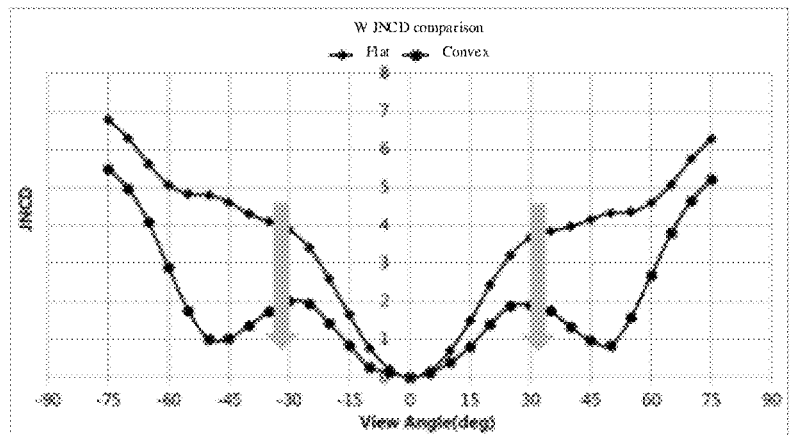
FIG. 12B schematically shows a color shift JNCD improvement effect diagram of a second sub-pixel in a case that a convex surface design and a flat surface design are adopted for an upper surface of a first electrode of the second sub-pixel.

FIG. 12A schematically shows a color shift trajectory diagram of a second sub-pixel in a case that a convex surface design and a flat surface design are adopted for an upper surface of a first electrode of the second sub-pixel. FIG. 12B schematically shows a color shift JNCD improvement effect diagram of a second sub-pixel in a case that a convex surface design and a flat surface design are adopted for an upper surface of a first electrode of the second sub-pixel. Table 2 schematically shows color shift JNCD improvement effect data of the second sub-pixel in the case that the convex surface design and the flat surface design are adopted for the upper surface of the first electrode of the second sub-pixel.

TABLE 2

| Color shift JNCD data of sub-pixel | | | |
|---|---|---|---|
| | WJNCD | | |
| Condition | 30° | 45° | 60° |
| Flat | 3.9 | 4.6 | 5.1 |
| Convex | 1.9 | 1.0 | 2.7 |

Referring to FIG. 12A, FIG. 12B and Table 2, in the case that the flat surface design is adopted, the color shift trajectory of the white picture under the large viewing angle is cyan and green; in the case that the convex surface design is adopted, the color shift trajectory of the white picture under the large viewing angle becomes cyan and yellow-green, and such a color shift trajectory may cause a significant reduction in the color shift level of the white picture under the large viewing angle. As shown in FIG. 12B and Table 2, the color shift level of the white picture under full viewing angle is reduced. A color shift level at 30° is reduced from 3.9 JNCD to 1.9 JNCD, a color shift level at 45° is reduced from 4.6 JNCD to 1.0 JNCD, and a color shift level at 60° is reduced from 5.1 JNCD to 2.7 JNCD.

In FIG. 9A, the orthographic projection of the main body of the first electrode of the first sub-pixel SP1 on the base substrate, the orthographic projection of the main body of the first electrode of the second sub-pixel SP2 on the base substrate and the orthographic projection of the main body of the first electrode of the third sub-pixel SP3 on the base substrate are rhombuses, but the embodiments of the present disclosure are not limited thereto.

Figure 9B:
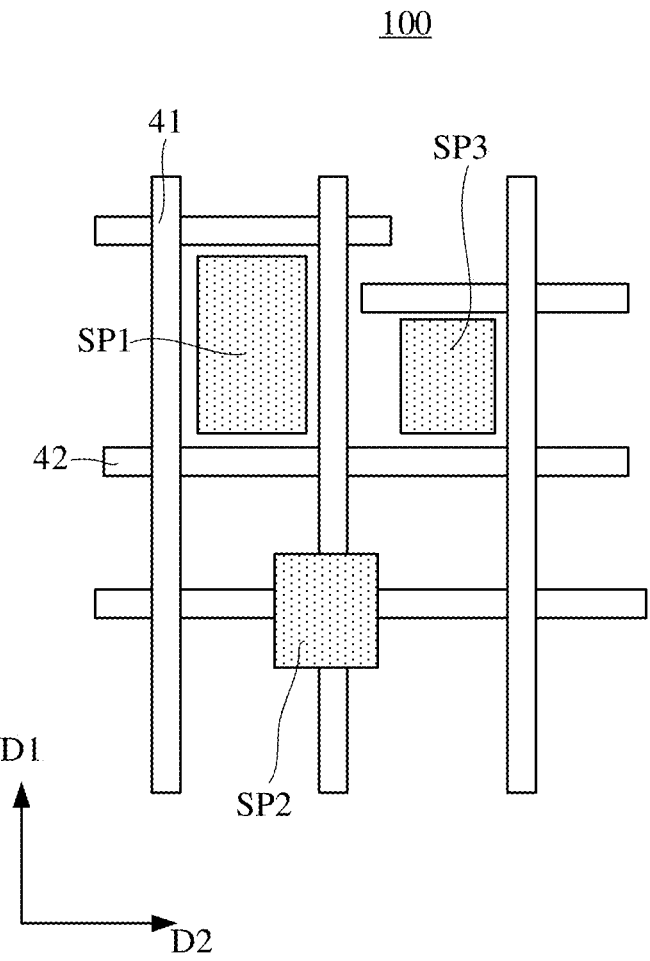
FIGS. 9B and 9C are partial plan views of a display substrate according to some other exemplary embodiments of the present disclosure, respectively.
Figure 9C:
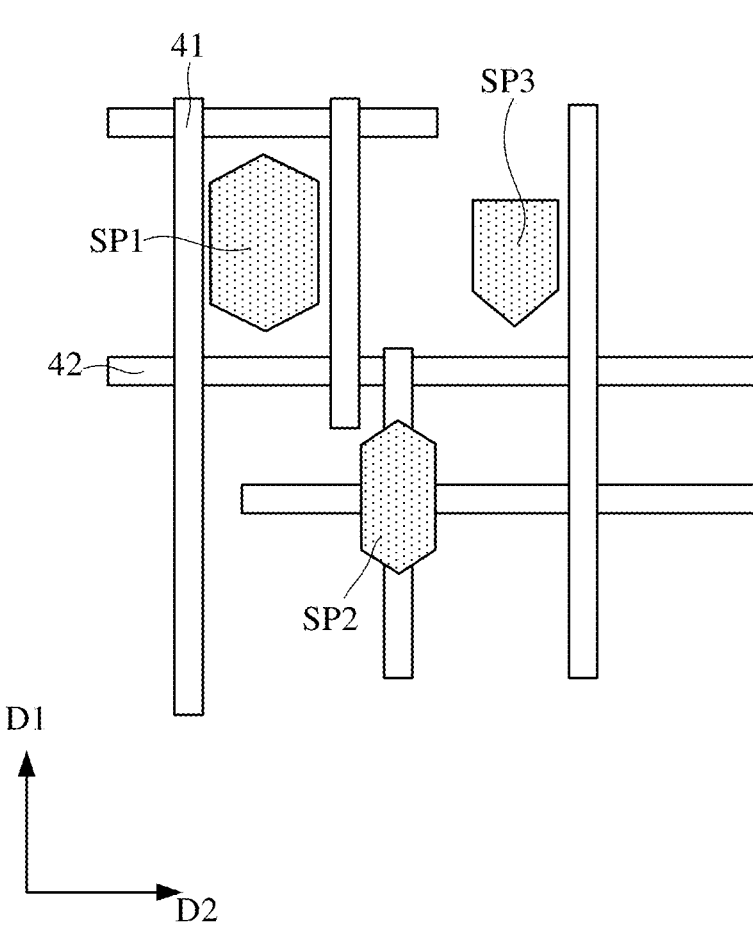

For example, FIG. 9B and FIG. 9C are partial plan views of the display substrate according to some other exemplary embodiments of the present disclosure, respectively. Referring to FIG. 9B, the orthographic projection of the main body of the first electrode of the first sub-pixel SP1 on the base substrate, the orthographic projection of the main body of the first electrode of the second sub-pixel SP2 on the base substrate and the orthographic projection of the main body of the first electrode of the third sub-pixel SP3 on the base substrate are rectangles. Referring to FIG. 9C, the orthographic projection of the main body of the first electrode of the first sub-pixel SP1 on the base substrate and the orthographic projection of the main body of the first electrode of the second sub-pixel SP2 on the base substrate are hexagons, and the orthographic projection of the main body of the first electrode of the third sub-pixel SP3 on the base substrate is a pentagon, but the embodiments of the present disclosure are not limited thereto. It should be understood that, a relative positional relationship between the first electrode and the signal line 4 shown in FIG. 9B and FIG. 9C as well as the inclined surface design of the first electrode may still refer to the design described above, which will not be repeated here.

In the embodiments of the present disclosure, without changing any OLED device structure, the luminance decay trend of the RGB primary colors under the large viewing angle may be changed by only changing a layout of the signal line under each sub-pixel and slightly changing the inclination angle of the first electrode surface of the light emitting device of the sub-pixel, which may significantly improve the color shift trajectory direction of the white picture under the large viewing angle and reduce the color shift level.

Figure 13:
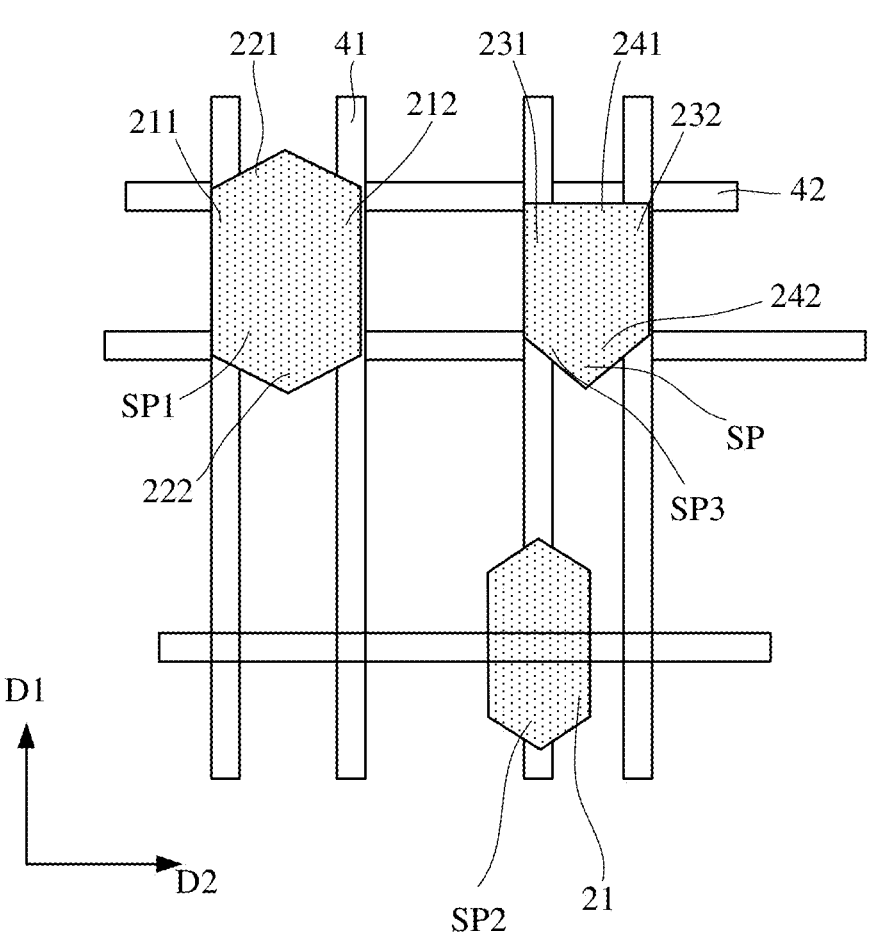
FIG. 13 is a partial plan view of a display substrate according to some exemplary embodiments of the present disclosure.

FIG. 13 is a partial plan view of a display substrate according to some exemplary embodiments of the present disclosure. Referring to FIG. 13, an orthographic projections of two first side edge portions 211 and 212 of the first electrode of the first sub-pixel on the base substrate 1 partially overlap with orthographic projections of two adjacent first signal lines 41 on the base substrate 1, respectively, so that a surface of the first electrode 21 of the first sub-pixel away from the base substrate 1 includes a first inclined surface recessed toward the first surface 11 in the direction from an edge of the first electrode 21 to a center of the first electrode 21, that is, the first electrode 21 of the first sub-pixel has a concave surface structure. An orthographic projection of the first electrode 21 of the light emitting device 2 of the second sub-pixel SP2 on the base substrate 1 at least partially overlaps with an orthographic projection of a first signal line 41 on the base substrate 1 and an orthographic projection of a second signal line 42 on the base substrate 1, so that a surface of the first electrode 21 of the second sub-pixel away from the base substrate 1 includes a second inclined surface protruding away from the first surface 11 in a direction from an edge of the first electrode 21 to a center of the first electrode 21, that is, the first electrode 21 of the second sub-pixel has a convex surface structure. An orthographic projections of two first side edge portions 231 and 232 of the first electrode 21 of the third sub-pixel SP3 on the base substrate 1 partially overlap with orthographic projections of two adjacent first signal lines 41 on the base substrate 1, respectively, so that a surface of the first electrode 21 of the third sub-pixel SP3 away from the base substrate 1 includes a third inclined surface recessed toward the first surface 11 in the direction from an edge of the first electrode 21 to a center of the first electrode 21, that is, the first electrode 21 of the third sub-pixel has a concave surface structure.

It should be understood that the embodiments of the present disclosure are not limited to the implementations described above. For example, in other embodiments, the orthographic projection of the first electrode of the first sub-pixel SP1 on the base substrate may not overlap with the orthographic projection of the signal line on the base substrate, that is, the first electrode of the first sub-pixel SP1 may have a flat surface structure, or the first electrode of the first sub-pixel SP1 may have the convex surface structure described above. For example, orthographic projections of two third side edge portions of the first electrode of the second sub-pixel SP2 on the base substrate partially overlap with orthographic projections of two adjacent first signal lines on the base substrate, respectively. That is, the first electrode of the second sub-pixel SP2 may have a concave surface structure. For example, the orthographic projection of the first electrode of the third sub-pixel SP3 on the base substrate may not overlap with the orthographic projection of the signal line on the base substrate, that is, the first electrode of the third sub-pixel SP3 may have a flat surface structure, or the first electrode of the third sub-pixel SP3 may have the convex surface structure described above.

In the embodiments of the present disclosure, by optimizing positional relationships between the first electrodes of the sub-pixels of different colors and the signal line, a flatness and the inclination angle of the first electrode are controlled in a targeted manner, and the luminance decay trends of the sub-pixels of different colors under the large viewing angle may be regulated, so as to realize a directional control of the color shift trajectory of the white picture under the large viewing angle, and achieve a purpose of significantly reducing the color coordinate deviation of the white picture under the large viewing angle. In the embodiments of the present disclosure, there is no need to modify the device structure of each sub-pixel in the OLED device, so that other optical characteristics such as color gamut, power consumption and lifetime under the positive viewing angle may not be affected, and there is a large space for optimizing the color shift. For different OLED material systems, a backplane design of the sub-pixels of different colors may be individually changed, or it is possible to achieve a personalized optimization under different OLED material systems by using an optimized combination of sub-pixels of different colors. In addition, in a case of using a same OLED material system, differentiated optimization color shift strategies for different customers may be conducted based on color shift characteristic requirements of different customers. For example, some customers pay more attention to a visual experience of human eyes, while some customers pay more attention to a control of the color shift level. In this way, production costs may be significantly reduced.

In the embodiments of the present disclosure, the first signal line 41 may include at least one of a dummy signal line, a driving voltage line for transmitting a driving voltage, and a data line for transmitting a data signal. The second signal line 42 may include a dummy signal line.

It should be noted that the expression "dummy signal line" may indicate a signal line that is not connected to a valid signal, that is, a signal line that does not participate in an operation of the pixel driving circuit. However, the embodiments of the present disclosure are not limited thereto. In some embodiments, in order to prevent the dummy signal line from floating, it may be considered to connect a fixed voltage signal such as a driving voltage, etc. to the dummy signal line.

It should be understood that, in the embodiments of the present disclosure, the display substrate may include a plurality of signal lines arranged on the base substrate 1. For example, the plurality of signal lines may include: a gate line for transmitting a scanning signal, a reset signal line for transmitting a reset signal, a light emitting control line for transmitting a light emitting control signal, a data line for transmitting a data signal, a driving voltage line for transmitting a driving voltage, and an initialization signal line for initializing voltage. In some embodiments, the first signal line may include at least one of a dummy signal line, a driving voltage line for transmitting a driving voltage, a data line for transmitting a data signal, and a reset signal line for transmitting a reset signal. The second signal line may include at least one of a dummy signal line, a gate line for transmitting a scanning signal, an initialization signal line for transmitting an initialization voltage, and a light emitting control line for transmitting a light emitting control signal.

For example, in some embodiments, the first signal line 41 and the second signal line 42 may be located in the same layer. In some embodiments, the first signal line 41 and the second signal line 42 may be respectively located in two adjacent conductive layers, such as the third conductive layer 33 and the fourth conductive layer 34 described above. In some embodiments, at least one of the first signal line 41 and the second signal line 42 may include two portions. One of the portions is located in one of two adjacent conductive layers (for example, the third conductive layer 33), and the other one of the portions is located in the other of the two adjacent conductive layers (for example, the fourth conductive layer 34).

In some embodiments, at least two signal lines overlapping with a same sub-pixel may be the same signal line or different signal lines. For example, at least two signal lines overlapping with the same sub-pixel may both be driving voltage lines or data lines. For another example, at least two signal lines overlapping with the same sub-pixel may be a combination of a driving voltage line and a data line.

In the embodiments of the present disclosure, the light emitting device 2 may include an top-emitting organic light emitting device, and the first electrode 21 may be an anode of the organic light emitting device.

At least some embodiments of the present disclosure further provide a display panel including the display substrate described above. For example, the display panel may be an OLED display panel.

Figure 15:
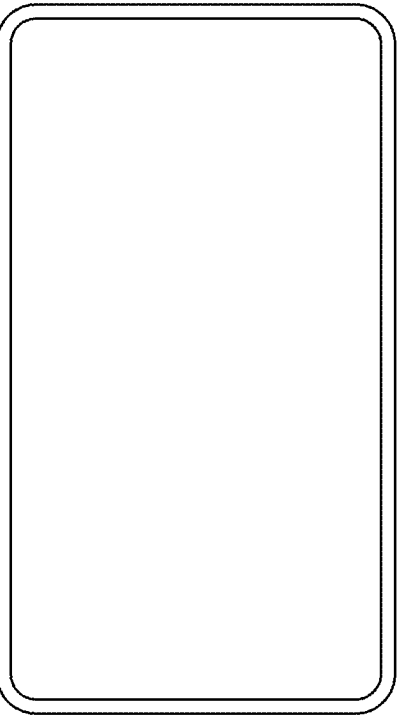
FIG. 15 is a schematic diagram of a display device according to some exemplary embodiments of the present disclosure.

Referring to FIG. 15, at least some embodiments of the present disclosure further provide a display device that may include the display substrate described above.

The display device may include any apparatus or product with a display function. For example, the display device may be a smart phone, a mobile phone, an e-book reader, a personal computer (PC), a laptop PC, a netbook PC, a personal digital assistant (PDA), a portable multimedia player (PMP), a digital audio player, a mobile medical apparatus, a camera, a wearable device (such as a head-mounted device, electronic clothing, an electronic bracelet, an electronic necklace, an electronic accessory, an electronic tattoo or a smart watch), a television, etc.

It should be understood that, the display panel and the display device according to the embodiments of the present disclosure have all the features and advantages of the display substrate described above. The details may be referred to the above description and will not be repeated here.

Although some embodiments of the general technical concept of the present disclosure have been illustrated and described, it should be understood by those ordinary skilled in the art that these embodiments may be changed without departing from the principle and spirit of the general technical concept of the present disclosure. The scope of the present disclosure is defined by the claims and their equivalents.

What is claimed is:

1. A display substrate, comprising:

a base substrate comprising a first surface;

a plurality of sub-pixels arranged on the first surface of the base substrate, wherein the plurality of sub-pixels are arranged on the base substrate in an array in a first direction and a second direction, one of the plurality of sub-pixels comprises a light emitting device and a pixel driving circuit for driving the light emitting device, the light emitting device comprises a first electrode, and the pixel driving circuit comprises a plurality of transistors comprising a source and a drain; and a plurality of signal lines arranged on the base substrate, wherein the plurality of signal lines are located in a same layer as the source and the drain of one of the plurality of transistors or located on a side of the source and the drain of one of the plurality of transistors away from the base substrate, wherein the plurality of signal lines comprise a plurality of first signal lines extending in the first direction, two adjacent first signal lines of the plurality of first signal lines are spaced apart in the second direction intersecting the first direction;

wherein the plurality of sub-pixels comprise a first sub-pixel, a first electrode of the light emitting device of the first sub-pixel comprises two first side edge portions oppositely arranged in the second direction, ortho-graphic projections of the two first side edge portions of the first electrode of the first sub-pixel on the base substrate partially overlap with orthographic projec-tions of the two adjacent first signal lines on the base substrate, respectively, so that a surface of the first electrode of the first sub-pixel away from the base substrate comprises a first inclined surface gradually recessed toward the first surface in a direction from an edge of the first electrode to a center of the first electrode;

wherein a cross section of the first inclined surface in the second direction has a V shape;

wherein the first inclined surface comprises a first inclined sub-surface inclined with respect to the first surface, and a second inclined sub-surface inclined with respect to the first surface;

wherein an intersection of the first inclined sub-surface and the second inclined sub-surface forms a bottom of the V shape, and an orthographic projection of the intersection on the base substrate is located between the orthographic projections of the two adjacent first signal lines on the base substrate;

wherein the plurality of sub-pixels comprise a second sub-pixel and a third sub-pixel, and an orthographic projection of a first electrode of a light emitting device of at least one of the second sub-pixel and the third sub-pixel on the base substrate does not overlap with an orthographic projection of the plurality of first signal lines on the base substrate, so that a surface of the first electrode of at least one of the second sub-pixel and the third sub-pixel away from the base substrate comprises a flat surface extending parallel to the first surface from an edge of the first electrode to a center of the first electrode; and wherein the first electrode of the light emitting device of the third sub-pixel comprises two third side edge por-tions oppositely arranged in the second direction, orthographic projections of the two third side edge portions of the first electrode of the third sub-pixel on the base substrate partially overlap with orthographic projections of the two adjacent first signal lines on the base substrate, respectively, so that a surface of the first electrode of the third sub-pixel away from the base substrate comprises a third inclined surface recessed toward the first surface in a direction from an edge of the first electrode to a center of the first electrode.

2. The display substrate of claim 1, wherein the plurality of signal lines further comprise a plurality of second signal lines extending in the second direction, the first electrode of the light emitting device of the first sub-pixel comprises two second side edge portions oppositely arranged in the first direction, and orthographic projections of the two second side edge portions of the first electrode of the first sub-pixel on the base substrate partially overlap with orthographic projections of two adjacent second signal lines of the plurality of second signal lines on the base substrate, respectively.

3. The display substrate of claim 2, wherein an orthographic projection of a first electrode of the light emitting device of the second sub-pixel on the base substrate partially overlaps with an orthographic projection of one of the plurality of first signal lines on the base substrate and an orthographic projection of one of the plurality of second signal lines on the base substrate, so that a surface of the first electrode of the second sub-pixel away from the base substrate comprises a second inclined surface gradually protruding away from the first surface in a direction from an edge of the first electrode toward a center of the first electrode.

4. The display substrate of claim 1, wherein the first electrode of the light emitting device of the third sub-pixel comprises two fourth side edge portions oppositely arranged in the first direction, and orthographic projections of the two fourth side edge portions of the first electrode of the third sub-pixel on the base substrate partially overlap with orthographic projections of the two adjacent second signal lines on the base substrate, respectively.

5. The display substrate of claim 2, wherein the orthographic projection of the intersection of the first inclined sub-surface and the second inclined sub-surface on the base substrate is located between the orthographic projections of the two adjacent second signal lines on the base substrate.

6. The display substrate of claim 3, wherein the second inclined surface comprises a third inclined sub-surface inclined with respect to the first surface, and a fourth inclined sub-surface inclined with respect to the first surface.

7. The display substrate of claim 6, wherein an orthographic projection of an intersection of the third inclined sub-surface and the fourth inclined sub-surface on the base substrate is located within the orthographic projection of the first signal line on the base substrate; or the orthographic projection of the intersection of the third inclined sub-surface and the fourth inclined sub-surface on the base substrate is located within the orthographic projection of the second signal line on the base substrate.

8. The display substrate of claim 1, wherein the third inclined surface comprises a fifth inclined sub-surface inclined with respect to the first surface, and a sixth inclined sub-surface inclined with respect to the first surface.

9. The display substrate of claim 8, wherein an orthographic projection of an intersection of the fifth inclined sub-surface and the sixth inclined sub-surface on the base substrate is located between the orthographic projections of the two adjacent first signal lines on the base substrate; or the orthographic projection of the intersection of the fifth inclined sub-surface and the sixth inclined sub-surface on the base substrate is located between the orthographic projections of the two adjacent second signal lines on the base substrate.

10. The display substrate of claim 2, wherein a ratio of a distance between an orthographic projection of an intersection of the first inclined sub-surface and the second inclined sub-surface on the base substrate and one of the orthographic projections of the two adjacent first signal lines on the base substrate in the second direction, to a distance between the orthographic projection of the intersection of the first inclined sub-surface and the second inclined sub-surface on the base substrate and the other of the orthographic projections of the two adjacent first signal lines on the base substrate in the second direction is within a range of 0.8 to 1.2; or a ratio of a distance between the orthographic projection of the intersection of the first inclined sub-surface and the second inclined sub-surface on the base substrate and one of the orthographic projections of the two adjacent second signal lines on the base substrate in the first direction, to a distance between the orthographic projection of the intersection of the first inclined sub-surface and the second inclined sub-surface on the base substrate and the other of the orthographic projections of the two adjacent second signal lines on the base substrate in the first direction is within a range of 0.8 to 1.2.

11. The display substrate of claim 6, wherein a straight line extending along the first signal line and a straight line extending along the second signal line intersect at a first intersection point, and an orthographic projection of an intersection of the third inclined sub-surface and the fourth inclined sub-surface on the base substrate at least partially overlaps with an orthographic projection of the first intersection point on the base substrate.

12. The display substrate of claim 8, wherein a ratio of a distance between an orthographic projection of an intersection of the fifth inclined sub-surface and the sixth inclined sub-surface on the base substrate and one of the orthographic projections of the two adjacent first signal lines on the base substrate in the second direction, to a distance between the orthographic projection of the intersection of the fifth inclined sub-surface and the sixth inclined sub-surface on the base substrate and the other of the orthographic projections of the two adjacent first signal lines on the base substrate in the second direction is within a range of 0.8 to 1.2; or a ratio of a distance between the orthographic projection of the intersection of the fifth inclined sub-surface and the sixth inclined sub-surface on the base substrate and one of the orthographic projections of the two adjacent second signal lines on the base substrate in the first direction, to a distance between the orthographic projection of the intersection of the fifth inclined sub-surface and the sixth inclined sub-surface on the base substrate and the other of the orthographic projections of the two adjacent second signal lines on the base substrate in the first direction is within a range of 0.8 to 1.2.

13. The display substrate of claim 8, wherein an inclination angle of the first inclined sub-surface with respect to the first surface and an inclination angle of the second inclined sub-surface with respect to the first surface are greater than 0° and less than or equal to 10°; or an inclination angle of a third inclined sub-surface with respect to the first surface and an inclination angle of a fourth inclined sub-surface with respect to the first surface are greater than 0° and less than or equal to 10°; or an inclination angle of the fifth inclined sub-surface with respect to the first surface and an inclination angle of the sixth inclined sub-surface with respect to the first surface are greater than 0° and less than or equal to 10°.

14. The display substrate of claim 2, wherein the first signal line comprises at least one of a dummy signal line, a driving voltage line for transmitting a driving voltage, a data line for transmitting a data signal, and a reset signal line for transmitting a reset signal; or the second signal line comprises at least one of a dummy signal line, a gate line for transmitting a scanning signal, an initialization signal line for transmitting an initialization voltage, and a light emitting control line for transmitting a light emitting control signal.

15. The display substrate of claim 2, wherein one of the plurality of first signal lines and one of the plurality of second signal lines are located in a same layer; or one of the plurality of first signal lines and one of the plurality of second signal lines are respectively located in two adjacent conductive layers; or at least one of the plurality of first signal lines and the plurality of second signal lines comprises two portions, one of the two portions is located in one of two adjacent conductive layers, and the other of the two portions is located in the other of the two adjacent conductive layers;

wherein the light emitting device comprises a top-emitting organic light emitting device, and the first electrode is an anode of the top-emitting organic light emitting device.

16. The display substrate of claim 1, wherein the first sub-pixel is a sub-pixel emitting blue light, a second sub-pixel is a sub-pixel emitting red light, and the third sub-pixel is a sub-pixel emitting green light.

17. A display panel comprising the display substrate of claim 1.

\* \* \* \* \*